(12) United States Patent
Sugiyama et al.

(10) Patent No.: US 7,808,098 B2
(45) Date of Patent: Oct. 5, 2010

(54) SEMICONDUCTOR DEVICE AND MANUFACTURING METHOD THEREOF

(75) Inventors: Eiji Sugiyama, Tochigi (JP); Yoshitaka Dozen, Tochigi (JP); Hisashi Ohtani, Tochigi (JP); Takuya Tsurume, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 112 days.

(21) Appl. No.: 12/073,613

(22) Filed: Mar. 7, 2008

(65) Prior Publication Data
US 2008/0224940 A1 Sep. 18, 2008

(30) Foreign Application Priority Data
Mar. 13, 2007 (JP) ............................. 2007-064052

(51) Int. Cl.
*H01L 23/14* (2006.01)
*H01Q 1/40* (2006.01)

(52) U.S. Cl. ................ 257/702; 343/873; 257/E21.002

(58) Field of Classification Search ................ 257/347, 257/E21.002, 428, 66, 702, 701, 678, 729; 438/127, 149, 46; 343/873
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,770,313 A | 6/1998 | Furumoto et al. | |
| 5,888,609 A * | 3/1999 | Karttunen et al. | ........... 428/107 |
| 6,224,965 B1 | 5/2001 | Haas et al. | |
| 6,403,221 B1 | 6/2002 | Nakamura et al. | |
| 6,530,147 B1 * | 3/2003 | Haas et al. | .................... 29/829 |
| 6,805,958 B2 | 10/2004 | Nakamura et al. | |
| 7,049,178 B2 | 5/2006 | Kim et al. | |
| 7,061,083 B1 | 6/2006 | Usami et al. | |
| 7,485,489 B2 | 2/2009 | Bjorbell | |

(Continued)

FOREIGN PATENT DOCUMENTS

EP 1092739 4/2001

(Continued)

OTHER PUBLICATIONS

Search Report (Application No. 08003900.1) Dated Apr. 8, 2009.

*Primary Examiner*—Thomas L Dickey
*Assistant Examiner*—Nikolay Yushin
(74) *Attorney, Agent, or Firm*—Eric J. Robinson; Robinson Intellectual Property Law Office, P.C.

(57) ABSTRACT

The present invention provides a semiconductor device which is not easily damaged by external local pressure. The present invention further provides a manufacturing method of a highly-reliable semiconductor device, which is not destroyed by external local pressure, with a high yield. A structure body, in which high-strength fiber of an organic compound or an inorganic compound is impregnated with an organic resin, is provided over an element substrate having a semiconductor element formed using a single crystal semiconductor region, and heating and pressure bonding are performed, whereby a semiconductor device is manufactured, to which the element substrate and the structure body in which the high-strength fiber of an organic compound or an inorganic compound is impregnated with the organic resin are fixed together.

24 Claims, 14 Drawing Sheets

U.S. PATENT DOCUMENTS

| | | |
|---|---|---|
| 2004/0016118 A1 | 1/2004 | Haas et al. |
| 2005/0233122 A1 | 10/2005 | Nishimura et al. |
| 2007/0020932 A1* | 1/2007 | Maruyama et al. .......... 438/687 |
| 2007/0278563 A1 | 12/2007 | Takano et al. |
| 2008/0012126 A1 | 1/2008 | Dozen et al. |

FOREIGN PATENT DOCUMENTS

| | | | |
|---|---|---|---|
| EP | 1589797 | | 10/2005 |
| JP | 05-190582 | | 7/1993 |
| JP | 07-007246 | * | 1/1995 |
| JP | 10-092980 | | 4/1998 |
| JP | 2004-078991 | | 3/2004 |
| JP | 2004-362341 | | 12/2004 |
| WO | WO-01/01740 | | 1/2001 |
| WO | WO-04/001848 | | 12/2003 |

* cited by examiner

SEMICONDUCTOR DEVICE AND MANUFACTURING METHOD THEREOF

BACKGROUND OF THE INVENTION

1. Field of the Invention

The present invention relates to a semiconductor device having a semiconductor element formed by using a single crystal semiconductor substrate or an SOI substrate and a manufacturing method of the semiconductor device.

2. Description of the Related Art

Currently, it is important to make various devices, such as wireless chips and sensors, into a thinner shape in miniaturizing products, and the technique and the application range spread rapidly. Such various devices which are made thin are flexible to some extent and thus the devices can be provided on an object having a curved surface.

In Patent Document 1 (Japanese Published Patent Application No. 2004-78991), a semiconductor device is disclosed, in which a semiconductor chip with the size of less than or equal to 0.5 mm is embedded in a paper or film medium, so that tolerance for bending and concentrated loading is improved.

SUMMARY OF THE INVENTION

However, in the case of a semiconductor device with a built-in (on-chip) antenna which is incorporated in a chip, the size of the antenna is small when the size of the chip is small, leading to a problem of a short communication distance. In the case where a semiconductor device is manufactured by connecting to a chip an antenna provided over a paper medium or a film medium, a poor connection is made and a yield is reduced when the size of the chip is small.

Accordingly, the present invention provides a semiconductor device which is not easily damaged by external local pressure. The present invention further provides a manufacturing method of a highly-reliable semiconductor device, which is not destroyed by external local pressure, with a high yield.

According to one aspect of the present invention, a structure body, in which a fibrous body of an organic compound or an inorganic compound is impregnated with an organic resin, is provided over an element substrate having a semiconductor element formed using a single crystal semiconductor substrate or an SOI substrate, and heating and pressure bonding are performed, whereby a semiconductor device is manufactured, where the element substrate and the structure body in which the fibrous body of an organic compound or an inorganic compound is impregnated with the organic resin are fixed together.

According to another aspect of the present invention, an element substrate having a semiconductor element formed using a single crystal semiconductor substrate or an SOI substrate is formed, and a structure body in which a fibrous body of an organic compound or an inorganic compound is impregnated with an organic resin is provided over the element substrate, and heating and pressure bonding are performed, whereby a sealing layer in which the fibrous body of an organic compound or an inorganic compound is impregnated with the organic resin is provided over the element substrate, and the element substrate is separated from a separation substrate, and thus, a semiconductor device is manufactured.

A semiconductor device of the present invention is a semiconductor device including an element substrate having a semiconductor element formed using a single crystal semiconductor substrate or an SOI substrate, and a sealing layer which is in contact with the element substrate and alleviates local pressure. By the organic resin, the element substrate and a fibrous body are fixed together, and further, the fibrous body is impregnated with the organic resin.

Another semiconductor device of the present invention is a semiconductor device including an element substrate having a semiconductor element formed using a single crystal semiconductor substrate or an SOI substrate, a fibrous body of an organic compound or an inorganic compound, and an organic resin by which the element substrate and the fibrous body are fixed together. By the organic resin, the element substrate and the fibrous body are fixed together, and further, the fibrous body is impregnated with the organic resin.

Another semiconductor device of the present invention is a semiconductor device including an element substrate having a semiconductor element formed using a single crystal semiconductor substrate or an SOI substrate, and a sealing layer including a fibrous body of an organic compound or an inorganic compound and an organic resin with which the fibrous body is impregnated.

The thickness of the element substrate is preferably greater than or equal to 1 µm and less than or equal to 80 µm, more preferably greater than or equal to 1 µm and less than or equal to 50 µm, still more preferably greater than or equal to 1 µm and less than or equal to 20 µm, still more preferably greater than or equal to 1 µm and less than or equal to 10 µm, still more preferably greater than or equal to 1 µm and less than or equal to 5 µm. The thickness of the sealing layer is preferably greater than or equal to 10 µm and less than or equal to 100 µm. When the sealing layer is formed to such a thickness, a semiconductor device capable of being curved can be manufactured.

The fibrous body is a woven fabric or a nonwoven fabric which uses high-strength fiber of an organic compound or an inorganic compound. The high-strength fiber is specifically fiber with a high tensile modulus of elasticity or fiber with a high Young's modulus.

Further, as the organic resin, a thermoplastic resin or a thermosetting resin can be used.

By using high-strength fiber as the fibrous body, even when local pressure is applied to a semiconductor device, the pressure is dispersed throughout the high-strength fiber; accordingly, partial stretching of the semiconductor device can be prevented. That is, destruction of a wiring, a semiconductor element, or the like, which is caused by partial stretching thereof, can be prevented.

According to the present invention, a highly-reliable semiconductor device which is not easily damaged by external local pressure can be manufactured with a high yield.

DETAILED DESCRIPTION OF THE INVENTION

Embodiment Mode

Figure 1A:
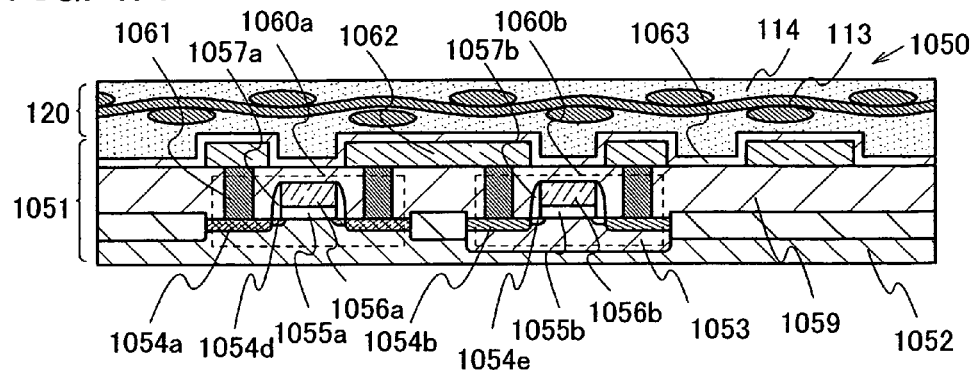
FIGS. 1A to 1D are cross-sectional views illustrating a semiconductor device of the present invention.

Embodiment modes of the present invention will be explained below with reference to the accompanying drawings. However, the present invention can be implemented in various different modes, and it will be readily apparent to those skilled in the art that various changes and modifications in modes and details thereof can be made without departing from the purpose and scope of the present invention. Therefore, the present invention should not be interpreted as being limited to the description of the embodiment modes below. It is to be noted that the same portions or portions having the same function are denoted by the same reference numerals through different drawings for illustrating the embodiment modes.

Embodiment Mode 1

This embodiment mode describes a highly-reliable semiconductor device which is not easily broken by local pressure (point pressure, linear pressure, and the like), with reference to FIGS. 1A to 1D, FIGS. 8A and 8B, and FIGS. 9A to 9D.

One aspect of a semiconductor device of this embodiment mode is that, over an element substrate including a semiconductor element formed using a single crystal semiconductor substrate or an SOI substrate, a sealing layer including a fibrous body of an organic compound or an inorganic compound and an organic resin with which the fibrous body is impregnated is formed.

As typical examples of a semiconductor element formed using a single crystal semiconductor substrate or an SOI substrate which is included in an element substrate, an active element such as a MOS transistor, a diode, or a nonvolatile memory element, and a passive element such as a resistor element or a capacitor element can be given. As a crystalline semiconductor substrate, a single crystal silicon substrate having n-type or p-type conductivity (a silicon wafer), or a compound semiconductor substrate (e.g., a GaAs substrate, an InP substrate, a GaN substrate, an SiC substrate, a sapphire substrate, or a ZnSe substrate) is preferably used. Alternatively, as an SOI substrate, the following substrate may be used: a so-called SIMOX (separation by implanted oxygen) substrate which is formed in such a manner that after oxygen ions are implanted into a mirror-polished wafer, an oxide layer is formed at a certain depth from the surface by high-temperature annealing and defects generated in a surface layer are eliminated; or an SOI substrate formed by using a technique called a Smart-Cut method in which an Si substrate is cleaved by utilizing growth of minute voids, which is formed by implantation of hydrogen ions, by thermal treatment; an ELTRAN (epitaxial layer transfer: a registered trademark of Canon Inc.) method; or the like. The thickness of the element substrate is preferably greater than or equal to 1 μm and less than or equal to 80 μm, more preferably greater than or equal to 1 μm and less than or equal to 50 μm, still more preferably greater than or equal to 1 μm and less than or equal to 20 μm, still more preferably greater than or equal to 1 μm and less than or equal to 10 μm, still more preferably greater than or equal to 1 μm and less than or equal to 5 μm. When the element substrate is formed to have such a thickness, a semiconductor device capable of being curved can be manufactured. The area of a top surface of the semiconductor device is preferably greater than or equal to 4 mm$^2$, more preferably greater than or equal to 9 mm$^2$.

FIGS. 1A to 1D are cross-sectional views of semiconductor devices of this embodiment mode.

In a semiconductor device 1050 shown in FIG. 1A, a fibrous body 113 is fixed to one surface of an element substrate 1051 including MOS transistors 1060a and 1060b by an organic resin 114. A sealing layer 120 is provided so as to cover a semiconductor element formed in the element substrate. Here, the fibrous body 113 and the organic resin 114 which are fixed to the element substrate 1051 are collectively referred to as the sealing layer 120. As a typical example of such a semiconductor device 1050, a microprocessor (MPU) which controls other devices or calculates and processes data can be given. An MPU includes a CPU, a main memory, a controller, an interface, an I/O port, and the like, and each of them can be formed using a MOS transistor, a resistor element, a capacitor element, a wiring, or the like.

The element substrate 1051 may have a photodiode. Typically, a photodiode such as a PN diode, a PIN diode, an avalanche diode, or a Schottky diode is formed on a semiconductor substrate. As a typical example of such a semiconductor device, an image sensor can be given.

Figure 1B:
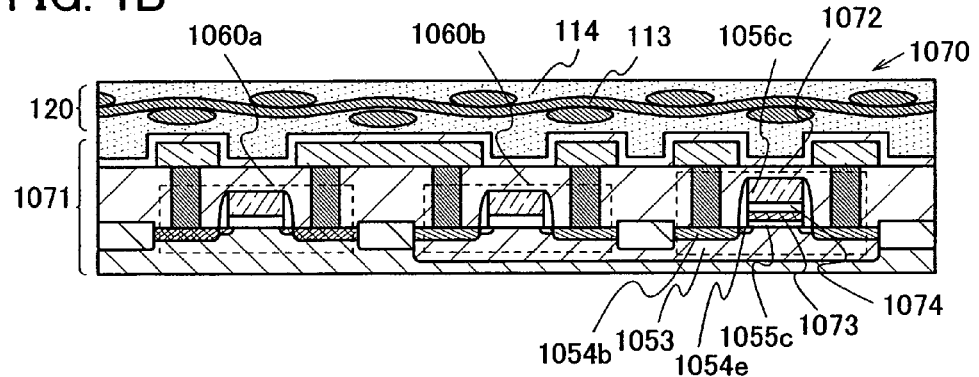

In a semiconductor device 1070 shown in FIG. 1B, a fibrous body 113 is fixed to one surface of an element substrate 1071 including a memory element 1072 and MOS transistors 1060a and 1060b, by an organic resin 114. As the memory element, a nonvolatile memory element including a floating gate or a charge storage layer; a MOS transistor and a capacitor element connected to the MOS transistor; a MOS transistor and a capacitor element including a ferroelectric layer which is connected to the MOS transistor; an organic memory element in which an organic compound layer is interposed between a pair of electrodes; or the like can be given. As semiconductor devices having such memory elements, memory devices such as DRAM (Dynamic Random Access Memory), SRAM (Static Random Access Memory), FeRAM (Ferroelectric Random Access Memory), mask ROM (Read Only Memory), EPROM (Electrically Programmable Read Only Memory), EEPROM (Electrically Erasable and Programmable Read Only Memory), and flash memory can be given. Here, a nonvolatile memory element including a floating gate electrode 1073 is shown as the memory element 1072.

Figure 1C:
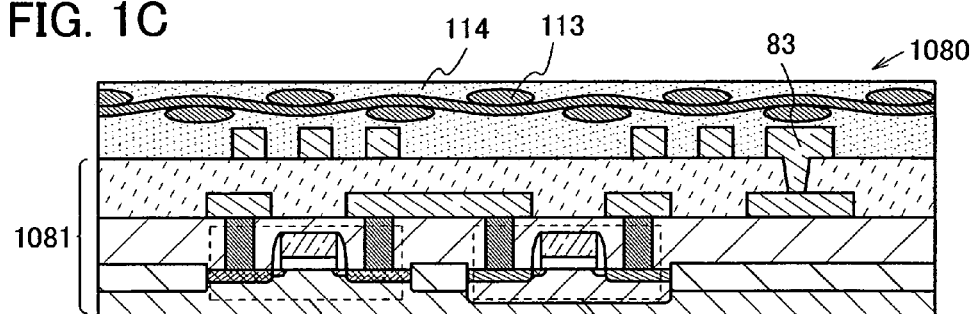

In a semiconductor device 1080 shown in FIG. 1C, a fibrous body 113 is fixed to one surface of an element substrate 1081 including MOS transistors 1060a and 1060b and an antenna 83 electrically connected to the MOS transistor 1060a or 1060b, by an organic resin 114. As typical examples of such a semiconductor device, an ID tag, an IC tag, an RF (radio frequency) tag, a wireless tag, an electronic tag, an RFID (radio frequency identification) tag, an IC card, an ID card, and the like, which can transmit and receive information wirelessly (hereinafter, referred to as an RFID) can be given. Further, a semiconductor device of the present invention includes an inlay in which an integrated circuit portion including a MOS transistor and the like and an antenna are sealed; and the inlay formed into a sticker or a card. Further, when the area of a top surface of the semiconductor device 1080 is greater than or equal to 4 mm$^2$, more preferably greater than or equal to 9 mm$^2$, the antenna can be formed to have a large area. Accordingly, an RFID with a long communication distance from a communication instrument can be obtained.

The element substrates 1051, 1071, and 1081 are preferably thinned by partially removing rear surface portions thereof. Typically, the thickness of the element substrates 1051, 1071, and 1081 is preferably greater than or equal to 1 μm and less than or equal to 80 μm, more preferably greater than or equal to 1 μm and less than or equal to 50 μm, still more preferably greater than or equal to 1 μm and less than or equal to 20 μm, still more preferably greater than or equal to 1 μm and less than or equal to 10 μm, still more preferably greater than or equal to 1 μm and less than or equal to 5 μm. Alternatively, each of the element substrates 1051, 1071, and 1081 may be thinned by separation of part of the semiconductor substrate.

Further, in addition to one surface of each of the element substrates shown in FIGS. 1A to 1C, the fibrous body 113 may also be fixed to the opposite surface by the organic resin. That is, opposing surfaces of the element substrate may each be provided with a sealing layer; thus, a pair of opposing sealing layers may be provided so as to cover a semiconductor element, which is formed in the element substrate, from opposing sides. In a semiconductor device 1090 shown in FIG. 1D, a sealing layer 120a is formed over one surface of the element substrate 1051 of the semiconductor device shown in FIG. 1A, and a sealing layer 120b is formed on the opposite surface of the element substrate 1051. The sealing layers 120a and 120b at this time are preferably formed from the same fibrous body and organic resin in order to reduce warpage. However, in the case of a use in which the front and the rear are distinguished from each other, it is not necessary that the sealing layers 120a and 120b are formed from the same material. In such a manner, the organic resin with which the fibrous body is impregnated is fixed to each of opposing surfaces of the element substrate, whereby the opposing surfaces of the element substrate are supported by the fibrous bodies. Therefore, reduction of warpage of the semiconductor device is possible, which makes it easy to mount the semiconductor device on a laminate film, a sticker, or the like.

The fibrous body 113 provided over one surface or opposing surfaces of the element substrate is a woven fabric or a nonwoven fabric which uses high-strength fiber of an organic compound or an inorganic compound, and the fibrous body 113 covers the entire surface of the element substrate. High-strength fiber is specifically fiber with a high tensile modulus of elasticity or fiber with a high Young's modulus. As typical examples of high-strength fiber, polyvinyl alcohol fiber, polyester fiber, polyamide fiber, polyethylene fiber, aramid fiber, polyparaphenylene benzobisoxazole fiber, glass fiber, carbon fiber, and the like can be given. As the glass fiber, glass fiber using E glass, S glass, D glass, Q glass, or the like can be used.

It is to be noted that the fibrous body 113 may be formed from one or more kinds of the above-described high-strength fiber.

The fibrous body 113 may be formed using a woven fabric which is woven using bundles of fiber (single yarn) (hereinafter, referred to as yarn bundles) for warp yarns and weft yarns, or a nonwoven fabric obtained by stacking yarn bundles of plural kinds of fiber in a random manner or in one direction. In the case of a woven fabric, a plain-woven fabric, a twilled fabric, a satin-woven fabric, or the like can be appropriately used.

The yarn bundle may have a circular shape or an elliptical shape in cross section. As the yarn bundle, a yarn bundle may be used which has been subjected to fiber opening with a high-pressure water stream, high-frequency vibration using liquid as a medium, continuous ultrasonic vibration, pressing with a roller, or the like. A yarn bundle which is subjected to fabric opening has a large width, has a smaller number of single yarns in the thickness direction, and has an elliptical shape or a flat shape in its cross section. Further, by using a loosely twisted yarn as the yarn bundle, the yarn bundle is easily flattened and has an elliptical shape or a flat shape in cross section. Use of a yarn bundle having an elliptical shape or a flat shape in cross section in this manner can make a thickness of the fibrous body 113 small. Accordingly, the thickness of the sealing layer 120 can be made small, and a thin semiconductor device can be manufactured. An effect of the present invention is observed when the width of the yarn bundle is greater than or equal to 4 μm and less than or equal to 400 μm, furthermore greater than or equal to 4 μm and less than or equal to 200 μm. Theoretically, the width of the yarn bundle may be even narrower than that. An effect of the present invention is observed when the thickness of the yarn bundle is greater than or equal to 4 μm and less than or equal to 20 μm. Theoretically, the thickness of the yarn bundle may be even smaller than that. The width and the thickness depend on a material of fiber.

In the drawings of this specification, the fibrous body 113 is shown as a woven fabric which is plain-woven using yarn bundles having an elliptical shape in cross section. Although the size of the MOS transistors 1060a and 1060b is larger than the width of a yarn bundle of the fibrous body 113, the size of the MOS transistors may be smaller than the width of a yarn bundle of the fibrous body 113.

Figure 8A:
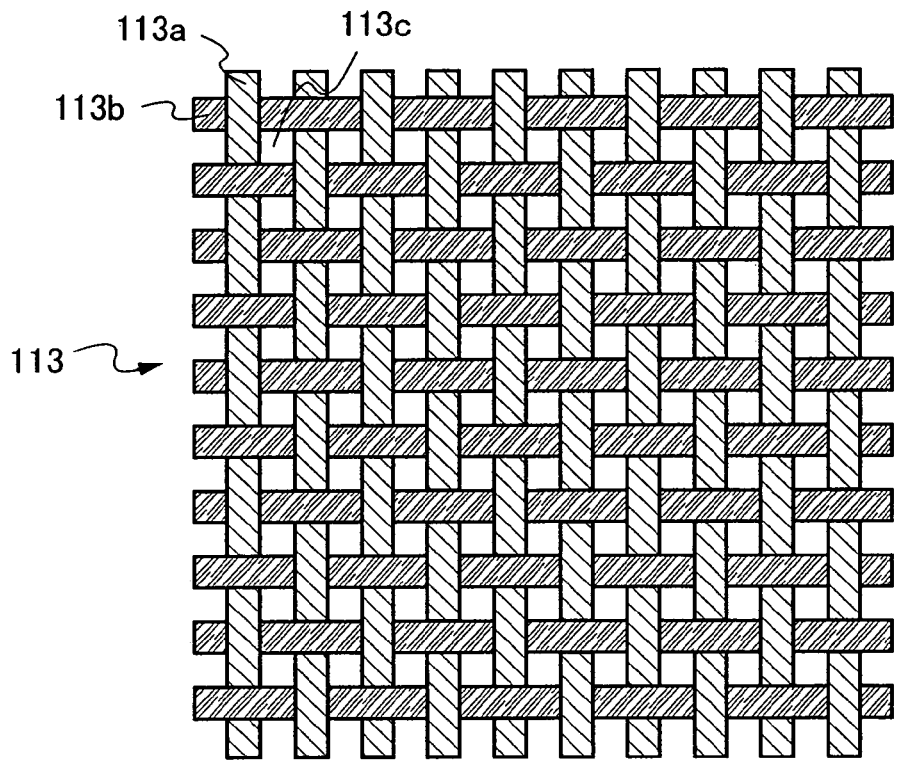
FIGS. 8A and 8B are top views each illustrating a fibrous body which can be applied to the present invention.
Figure 8B:
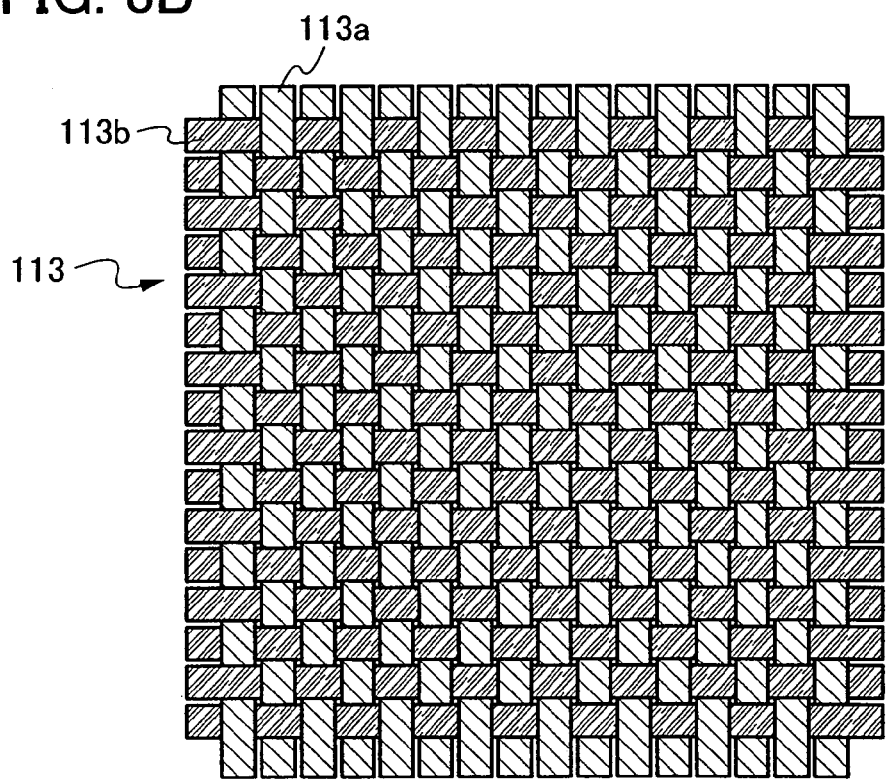
Figure 9A:
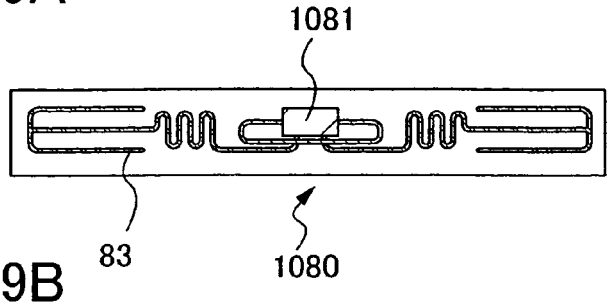
FIGS. 9A to 9D are top views each illustrating an antenna which can be applied to the present invention.
Figure 9B:
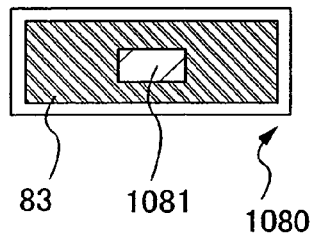
Figure 9C:
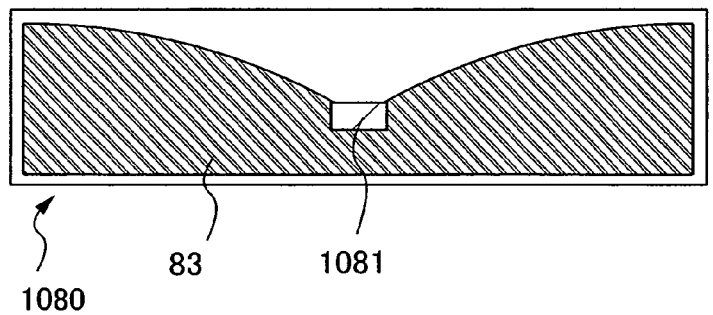
Figure 9D:
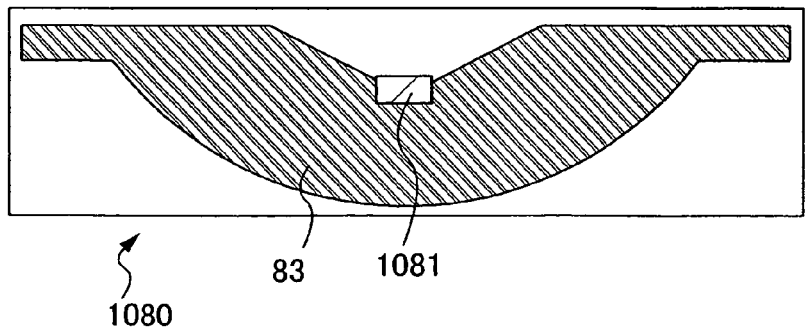

FIGS. 8A and 8B each show a top view of a woven fabric as the fibrous body 113 which is woven using yarn bundles for warp yarns and weft yarns.

As shown in FIG. 8A, the fibrous body 113 is woven using warp yarns 113a spaced at regular intervals and weft yarns 113b spaced at regular intervals. Such a fibrous body has regions without the warp yarns 113a and the weft yarns 113b (referred to as basket holes 113c). In such a fibrous body 113, the fibrous body is further impregnated with an organic resin, whereby adhesiveness between the fibrous body 113 and the element substrate can be further increased.

As shown in FIG. 8B, in the fibrous body 113, density of the warp yarns 113a and the weft yarns 113b may be high and a proportion of the basket holes 113c may be low. Typically, the size of the basket hole 113c is preferably smaller than the area of a locally pressed portion. More typically, the basket hole 113c preferably has a rectangular shape having a side with a length greater than or equal to 0.01 mm and less than or equal to 0.2 mm. When the basket hole 113c of the fibrous body 113 has such a small area, even when pressure is applied by a member with a sharp tip (typically, a writing material such as a pen or a pencil), the pressure can be absorbed by the entire fibrous body 113.

Further, in order to enhance permeability of an organic resin into the inside of the yarn bundle, the yarn bundle may be subjected to surface treatment. For example, as the surface treatment, corona discharge, plasma discharge, or the like for activating a surface of the yarn bundle can be given. Further, surface treatment using a silane coupling agent or a titanate coupling agent can be given.

As the organic resin 114 with which the fibrous body 113 is impregnated and the surface of the element substrate is sealed, a thermosetting resin such as an epoxy resin, an unsaturated polyester resin, a polyimide resin, a bismaleimide-triazine resin, or a cyanate resin can be used. Further, a thermoplastic resin such as a polyphenylene oxide resin, a polyetherimide resin, or a fluorine resin can be used. Furthermore, a plurality of the above-described thermosetting resin and thermoplastic resin may be used. When the above-described organic resin is used, the fibrous body can be fixed to the element substrate by thermal treatment. The higher the glass transition temperature of the organic resin 114 is, the harder the organic resin 114 is destroyed by local pressure, which is preferable.

The thickness of the sealing layer 120 is preferably greater than or equal to 10 μm and less than or equal to 100 μm, more preferably greater than or equal to 10 μm and less than or equal to 30 μm. When a sealing layer with such a thickness is used, a thin semiconductor device capable of being curved can be manufactured.

Highly thermally-conductive filler may be dispersed in the organic resin 114 or the yarn bundle of the fibrous body. As the highly thermally-conductive filler, an aluminum nitride, a boron nitride, a silicon nitride, alumina, or the like can be given. As the highly thermally-conductive filler, metal particles of silver, copper, or the like can also be given. When the conductive filler is included in the organic resin or the yarn bundle, heat generated in the element substrate can be easily released to the outside. Accordingly, thermal storage of the semiconductor device can be suppressed, and destruction of the semiconductor device can be reduced.

Figure 1D:
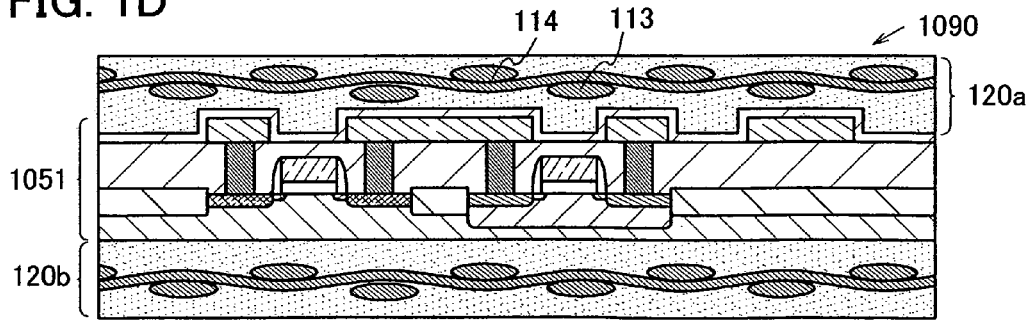

In FIG. 1D, the direction of the warp yarn or the weft yarn of the fibrous body of the sealing layer 120a formed over the element substrate 1051 and the direction of the warp yarn or the weft yarn of the fibrous body of the sealing layer 120b may be shifted from each other by 30° or more and 60° or less, more preferably 40° or more and 50° or less. In this case, since tensile directions of the fibrous bodies provided on the front and the rear of the element substrate are different from each other, stretching due to local pressure is isotropic. Thus, destruction by local pressure can be further reduced.

Here, an effect of the semiconductor device in this embodiment mode is described with reference to FIGS. 2A to 2D.

Figure 2A:
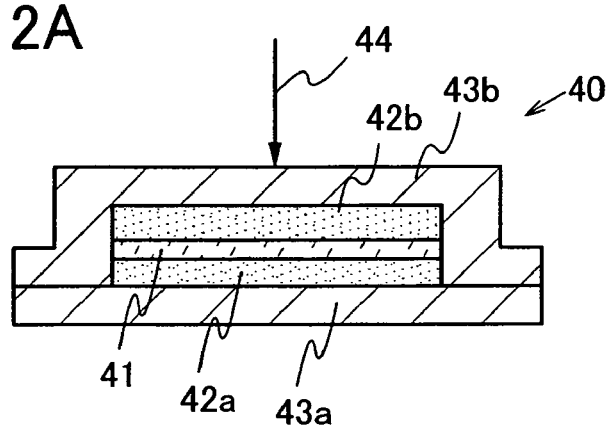
FIGS. 2A to 2D are cross-sectional views illustrating a manufacturing method of a semiconductor device of the present invention.

As shown in FIG. 2A, in a conventional semiconductor device 40, an element substrate 41 including a semiconductor element formed using a single crystal semiconductor substrate or an SOI substrate is sealed with films 43a and 43b with the use of adhesive members 42a and 42b. Local pressure 44 is applied to a semiconductor device having such a structure.

Figure 2B:
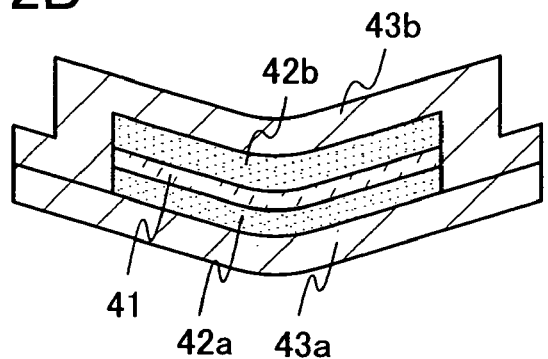

As a result, as shown in FIG. 2B, a layer which forms the element substrate 41, the adhesive members 42a and 42b, and the films 43a and 43b are each stretched, and a curve with a small radius of curvature is generated in the pressed portion. Accordingly, the semiconductor element included in the element substrate 41, a wiring, or the like is cracked, and the semiconductor device is destroyed.

Figure 2C:
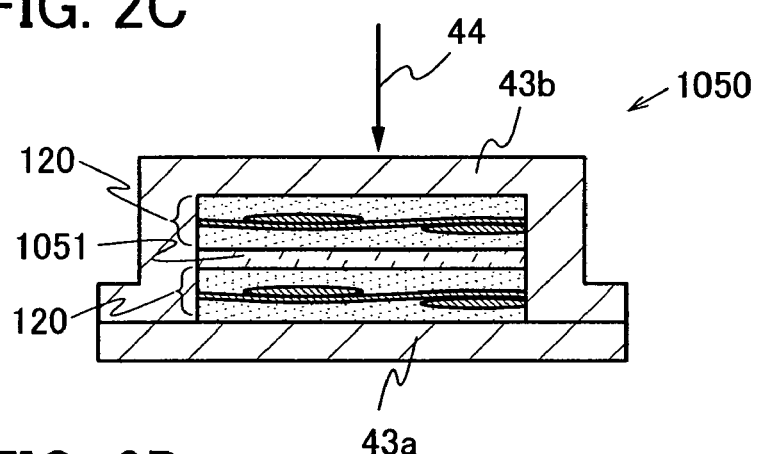
Figure 2D:
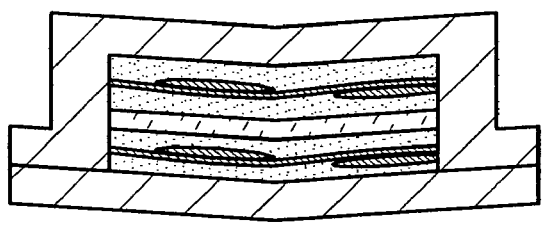

However, in a semiconductor device 1050 described in this embodiment mode, as shown in FIG. 2C, a sealing layer formed of a fibrous body including an organic resin is provided on one side or opposite sides of an element substrate 1051. Fiber which forms the fibrous body has a high tensile modulus of elasticity or a high Young's modulus. Accordingly, even when the local pressure 44 such as point pressure or linear pressure is applied, the fiber is not stretched. Pressing force is dispersed throughout the fibrous body, and the whole semiconductor device is curved. Thus, even when local pressure is applied, a curve generated in the semiconductor device has a large radius of curvature, and the semiconductor element included in the element substrate 1051, a wiring, and the like are not cracked, and accordingly, destruction of the semiconductor device can be reduced.

Further, when the element substrate 1051 is formed to have a small thickness, the semiconductor device can be curved. Accordingly, the area of the element substrate 1051 can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

A structure of a semiconductor element formed using a single crystal semiconductor substrate or an SOI substrate is described below.

The MOS transistor 1060a shown in FIG. 1A includes a semiconductor substrate 1052, a gate insulating layer 1055a, and a gate electrode 1056a. The MOS transistor 1060b includes a p-well region 1053, a gate insulating layer 1055b, and a gate electrode 1056b. In the case where the semiconductor substrate 1052 has n-type conductivity, the p-well region 1053 into which a p-type impurity is injected is formed. For example, boron is used as the p-type impurity and added at a concentration of approximately $5\times10^{15}$ to $1\times10^{16}$ $cm^{-3}$. When the p-well region 1053 is formed, an n-channel transistor can be formed in this region. In addition, the p-type impurity added to the p-well region 1053 also has a function of controlling the threshold voltage of the MOS transistor. Channel formation regions which are formed in the semiconductor substrate 1052 and the p-well region 1053 are formed in regions that roughly match the gate electrodes 1056a and 1056b and located between low concentration impurity regions 1054d and between low concentration impurity regions 1054e, or between a pair of impurity regions 1054a and between a pair of impurity regions 1054b, respectively. It is to be noted that the semiconductor substrate 1052 may be formed using a p-type semiconductor substrate, and the p-well region 1053 may be an n-well region to which an n-type impurity is added.

The pairs of impurity regions 1054a and 1054b serve as sources and drains in the MOS transistors. The pairs of impurity regions 1054a and 1054b are formed by addition of phosphorus or arsenic, which is an n-type impurity, and boron, which is a p-type impurity, respectively at approximately $1\times10^{19}$ to $1\times10^{21}$ $atoms/cm^3$.

Spacers 1057a and 1057b are formed on sidewalls of the gate electrodes 1056a and 1056b, respectively. When the spacers 1057a and 1057b are formed, an advantageous effect is obtained in that leakage current at edges of the gate electrodes 1056a and 1056b is prevented. In addition, with the use of the spacers 1057a and 1057b, the low concentration impurity regions 1054d and 1054e can be formed under both edges of the gate electrodes 1056a and 1056b in a channel length direction, respectively. Each of the low concentration impurity regions 1054d and 1054e serves as a lightly doped drain (LDD). The low concentration impurity regions 1054d and 1054e are not necessarily formed; however, when these regions are provided, an electric field at each drain edge can be moderated and deterioration of the MOS transistor can be suppressed.

The gate insulating layers 1055a and 1055b can be formed of a silicon oxide film obtained by oxidizing a surface of the semiconductor substrate 1052 with thermal treatment. Alternatively, the gate insulating layers 1055a and 1055b may be formed of a stacked-layer structure of a silicon oxide film and a film containing oxygen and nitrogen (a silicon oxynitride film) by forming the silicon oxide film with a thermal oxidation method and then nitriding the surface of the silicon oxide film with nitridation treatment. The gate insulating layers 1055a and 1055b are formed from an inorganic insulator such as a silicon oxide or a silicon nitride to a thickness of 5 to 50 nm. Further alternatively, as the gate insulating layers 1055a and 1055b, a metal oxide such as a tantalum oxide, a hafnium oxide, a hafnium silicate oxide, a zirconium oxide, an aluminum oxide, or a titanium oxide; or a rare-earth oxide such as a lanthanum oxide, each of which is a high dielectric constant substance (also referred to as a high-k material), can be formed.

It is preferable that the gate electrodes 1056a and 1056b be formed of metal selected from tantalum (Ta), tungsten (W), titanium (Ti), molybdenum (Mo), chromium (Cr), niobium (Nb), and the like, or an alloy material or compound material containing any of the metal elements as its main component. Alternatively, polycrystalline silicon to which an impurity element such as phosphorus is added can be used. Further alternatively, the gate electrodes may be formed of a stacked-layer structure including one layer or plural layers of metal nitride layers and a metal layer containing any of the above-described metal. As the metal nitride, a tungsten nitride, a molybdenum nitride, or a titanium nitride can be used. When the metal nitride layer is provided, adhesiveness of the metal layer formed over the metal nitride layer can be increased; accordingly, separation can be prevented.

An insulating layer 1059 serves as an interlayer insulating layer for insulating the MOS transistors and a conductive layer serving as a wiring. The insulating layer 1059 can be formed of either a single layer or a stacked-layer structure of an insulating layer containing oxygen and/or nitrogen, such as a silicon oxide, a silicon nitride, a silicon oxynitride, or a silicon nitride oxide; a layer containing carbon such as DLC (diamond-like carbon); an organic material such as epoxy, polyimide, polyamide, polyvinyl phenol, benzocyclobutene, or acrylic; or a siloxane material such as a siloxane resin, by a CVD method, a sputtering method, or the like.

Conductive layers 1061 and 1062 each serve as a wiring, a plug, or the like. The conductive layers 1061 and 1062 are formed in a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the elements as its main component by a CVD method, a sputtering method, or the like. An alloy material containing aluminum as its main component corresponds to, for example, a material which contains aluminum as its main component and also contains nickel, or an alloy material which contains aluminum as its main component and also contains nickel and one or both of carbon and silicon. The conductive layers 1061 and 1062 are preferably formed of a stacked-layer structure of a barrier film, an aluminum silicon film, and a barrier film or a stacked-layer structure of a barrier film, an aluminum silicon film, a titanium nitride film, and a barrier film. Note that a "barrier film" corresponds to a thin film formed of titanium, a nitride of titanium, molybdenum, or a nitride of molybdenum. Aluminum and aluminum silicon are suitable materials for forming the conductive layers 1061 and 1062 because they have low resistance and are inexpensive. When barrier films are provided as the top layer and the bottom layer, generation of hillocks of aluminum or aluminum silicon can be prevented. In addition, when a barrier film is formed of titanium which is an element having a high reducing property, even when a thin natural oxide film is formed on a semiconductor substrate, the natural oxide film can be reduced, and a favorable contact with the semiconductor substrate can be obtained.

An insulating layer 1063 serving as a protective film may be formed over the conductive layer 1062 and the insulating layer 1059. The insulating layer 1063 is formed from a silicon nitride, a silicon nitride oxide, a carbon nitride, DLC, or the like. When the insulating layer 1063 serving as a protective film is provided, intrusion of moisture from outside into the MOS transistors can be suppressed, and accordingly, reliability of electric characteristics of the MOS transistors and the semiconductor device can be increased.

Further, over the insulating layer 1063, one pair or plural pairs of a conductive layer and an insulating layer which insulates the conductive layer may be formed in a multilayer structure. With a multilayer structure, high integration is possible. In this case, the insulating layer which insulates the conductive layer is preferably formed from a low dielectric constant material with a dielectric constant less than or equal to 4 such as SiOF, SiOC, DLC, or porous silica. A low dielectric constant material with a dielectric constant less than or equal to 4 is also referred to as a low-k material, and a film formed from a low-k material is referred to as a low-k film. When an insulating layer is formed from a low-k material in such a manner, capacitance between wirings can be lowered, and power consumption can be reduced.

The memory element 1072 shown in FIG. 1B is a nonvolatile memory element including a p-well region 1053, a tunnel oxide layer 1055c, the floating gate electrode 1073, a control insulating layer 1074, and a control gate electrode 1056c.

The tunnel oxide layer 1055c can be formed using a single layer of a silicon oxide or formed to have a stacked-layer structure of a silicon oxide and a silicon nitride, with a thickness of 1 to 10 nm, preferably 1 to 5 nm, by a low pressure CVD method, a plasma CVD method, a thermal oxidation method, or the like. Further, the tunnel oxide layer can be formed by oxidizing or nitriding a semiconductor layer by plasma treatment. Furthermore, a silicon oxide formed by a plasma CVD method may be oxidized or nitrided by plasma treatment. An insulating layer formed by the plasma treatment is dense, has high dielectric strength, and is excellent in reliability.

The floating gate electrode 1073 can be formed using a conductive layer, a polysilicon layer, silicon dots, or the like. Instead of the floating gate electrode, a charge storage layer formed from a silicon nitride, a germanium nitride, or the like may be used.

The control insulating layer 1074 is formed of a single layer or a plurality of layers of a silicon oxide, a silicon nitride, a silicon oxynitride, an aluminum oxide, or the like by a low pressure CVD method, a plasma CVD method, or the like. The second insulating layer 22 is formed to a thickness of 1 to 20 nm, preferably 5 to 10 nm.

The antenna 83 shown in FIG. 1C is formed in such a manner that a droplet or paste which includes any one or more of metal particles of silver (Ag), gold (Au), copper (Cu), nickel (Ni), platinum (Pt), palladium (Pd), tantalum (Ta), molybdenum (Mo), titanium (Ti), and the like is discharged by a droplet discharge method (an ink-jet method, a dispenser method, or the like), and it is dried and baked. When the antenna is formed by a droplet discharge method, the number of process steps can be reduced, and cost can be reduced accordingly.

Further, the antenna 83 may be formed by a screen printing method. In the case of using a screen printing method, as a material for the antenna 83, a conductive paste where conductive particles having a particle size of several nanometers to several tens of micrometers are dissolved or dispersed in an organic resin is selectively printed. As the conductive particles, particles or dispersing nanoparticles of one or more metals of silver (Ag), gold (Au), copper (Cu), nickel (Ni), platinum (Pt), palladium (Pd), tantalum (Ta), molybdenum (Mo), titanium (Ti), and the like, or silver halide can be used. In addition, as the organic resin included in the conductive paste, one or more selected from organic resins functioning as a binder, a solvent, a dispersive agent, and a coating member of the metal particles can be used. Typically, an organic resin such as an epoxy resin or a silicone resin can be given. Further, in forming the conductive layer, baking is preferably performed after the conductive paste is pushed out.

Alternatively, the antenna 83 may be formed using gravure printing or the like instead of a screen printing method or may be formed from a conductive material by a plating method, a sputtering method, or the like.

As a signal transmission method in an RFID, an electromagnetic coupling method or an electromagnetic induction method (for example, 13.56 MHz band) is applied. In the case of utilizing electromagnetic induction caused by a change in magnetic field density, the shape of the upper surface of the antenna can be a ring shape (for example, a loop antenna) or a spiral shape (for example, a spiral antenna).

Alternatively, a microwave method (for example, a UHF band (860 to 960 MHz band), a 2.45 GHz band, or the like) can be employed as the signal transmission method in an RFID. In that case, the length, shape, or the like of the antenna may be appropriately set in consideration of a wavelength of an electromagnetic wave used for signal transmission.

FIGS. 9A to 9D each show an example of the antenna 83 of an RFID to which a microwave method can be adapted. For example, the shape of the upper surface of the antenna can be a linear shape (for example, a dipole antenna (see FIG. 9A)), a flat shape (for example, a patch antenna (see FIG. 9B)), a ribbon shape (see FIGS. 9C and 9D), or the like. Further, the shape of the conductive layer serving as an antenna is not limited to a linear shape, and may be a curved shape, a meandering shape, or a shape combining these, in consideration of the wavelength of an electromagnetic wave.

In embodiment modes below, a manufacturing method of a semiconductor device described in this embodiment mode is to be described by using an RFID as an example of the semiconductor device.

Embodiment Mode 2

Figure 3A:
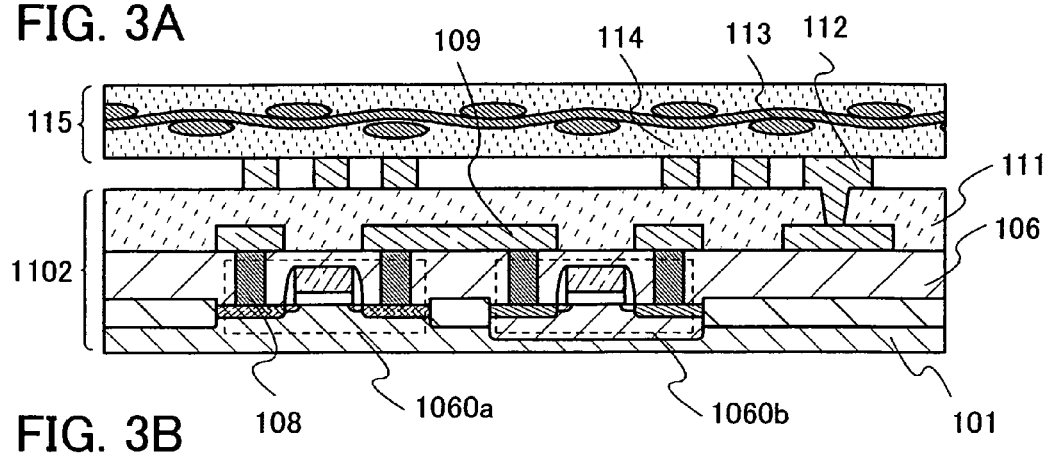
FIGS. 3A to 3C are cross-sectional views illustrating a manufacturing method of a semiconductor device of the present invention.
Figure 3B:
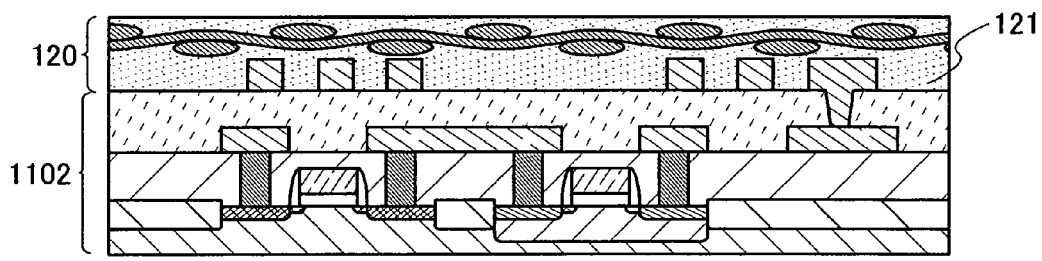
Figure 3C:
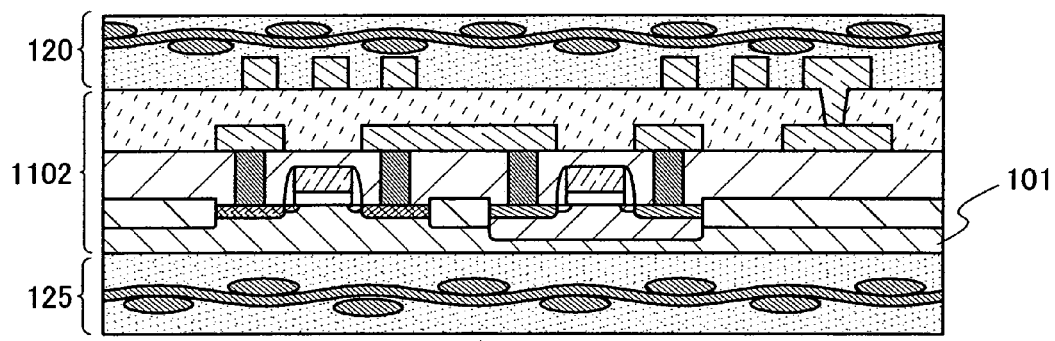

This embodiment mode describes a manufacturing method of a semiconductor device, which is not easily damaged by external local pressure, with a high yield with reference to FIGS. 3A to 3C.

As shown in FIG. 3A, an element substrate 1102 including a semiconductor element formed using a single crystal semiconductor substrate or an SOI substrate, and an antenna 112 are formed. Then, a structure body 115 in which a fibrous body is impregnated with an organic resin is provided over the element substrate 1102 and the antenna 112. The thickness of the element substrate 1102 is preferably greater than or equal to 1 µm and less than or equal to 80 µm, more preferably greater than or equal to 1 µm and less than or equal to 50 µm, still more preferably greater than or equal to 1 µm and less than or equal to 20 µm, still more preferably greater than or equal to 1 µm and less than or equal to 10 µm, still more preferably greater than or equal to 1 µm and less than or equal to 5 µm. When the element substrate 1102 has such a thickness, a semiconductor device capable of being curved can be manufactured.

Here, as typical examples of a semiconductor element formed using a single crystal semiconductor substrate or an SOI substrate, the MOS transistors 1060a and 1060b formed using the single crystal semiconductor substrate described in Embodiment Mode 1 are shown.

Here, in the element substrate 1102 including a semiconductor element formed using a single crystal semiconductor substrate or an SOI substrate, the following are shown: the MOS transistors 1060a and 1060b; an insulating layer 106 which covers the MOS transistors 1060a and 1060b; wirings 108 and 109 which are connected to source regions and drain regions in the semiconductor substrate of the MOS transistor 1060a and in the p-well region 1053 of the MOS transistor 1060b through the insulating layer 106; and an insulating layer 111 which covers the wirings 108 and 109 and the insulating layer 106. The antenna 112 connected to the wiring 109 through the insulating layer 111 is formed over the element substrate 1102.

The insulating layer 106 serves as an interlayer insulating layer which insulates the MOS transistors and the wirings. The insulating layer 106 is formed in a single layer or a multilayer using an inorganic compound by a sputtering method, a plasma CVD method, a coating method, a printing method, or the like. As typical examples of the inorganic compound, a silicon oxide, a silicon nitride, a silicon oxynitride, a silicon nitride oxide, and the like can be given. Although having a single-layer structure here, the insulating layer 106 can be formed of a stacked-layer structure. Here, the insulating layer 106 is formed by applying a composition, in which an epoxy resin is diluted with an organic solvent, by a coating method and performing drying and baking thereon.

The wirings 108 and 109 can be formed in a similar manner to the conductive layers 1061 and 1062 which are described in Embodiment Mode 1. Here, the wirings 108 and 109 are formed in such a manner that a titanium layer, an aluminum layer, and a titanium layer are stacked in this order, and then, etching is selectively performed using a resist mask formed by a photolithography process.

A protective layer of a silicon nitride, a silicon nitride oxide, diamond-like carbon, carbon nitride, or the like may be provided over the wirings 108 and 109. When the protective layer is provided, moisture intrusion from outside into the MOS transistors can be prevented, so that reliability of electric characteristics of the MOS transistors and the semiconductor device can be improved.

The insulating layer 111 is formed using a formation method and a material which are similar to those of the insulating layer 106. It is to be noted that the insulating layer 111 is a base layer of an antenna formed later; therefore, a surface of the insulating layer 111 is preferably flat. Accordingly, the insulating layer 111 is preferably formed by applying a composition in which an organic resin is diluted with an organic solvent and performing drying and baking thereon. Further, when the insulating layer 111 is formed using a composition in which a photosensitive resin is diluted, the number of process steps is reduced compared with a process in which etching is performed using a resist mask formed by a conventional photolithography process, leading to a high yield. Here, the insulating layer 111 is formed in such a manner that a composition in which a photosensitive polyimide resin is diluted with an organic solvent is applied and dried; light exposure using a photomask is performed thereon; and then, an uncured portion is removed and baking is performed.

The antenna 112 is formed using a formation method and a material which are similar to those of the antenna 83 described in Embodiment Mode 1. Here, the antenna 112 is formed in such a manner that an aluminum layer is formed by a sputtering method, and then, etching is selectively performed using a resist mask formed by a photolithography process.

The element substrate 1102 is preferably thinned by partially removing a rear surface portion thereof. As methods for partially removing the rear surface portion, physical polishing and chemical removal can be given. Physical polishing is performed in such a manner that a protective tape is stuck on a front surface of a semiconductor substrate (a side where a semiconductor element is formed), and then, a rear surface of the semiconductor substrate is mechanically ground, and the rear surface is polished by chemical mechanical polishing. As chemical removal, dry etching using a gas such as $SF_6$ or $CF_4$; dry etching using a liquid mixture of hydrofluoric acid, nitric acid, and acetic acid, or an aqueous solution of potassium hydroxide; or the like can be given. Typically, the thickness of the element substrate 1102 is preferably greater than or equal to 1 μm and less than or equal to 80 μm, more preferably greater than or equal to 1 μm and less than or equal to 50 μm, still more preferably greater than or equal to 1 μm and less than or equal to 20 μm, still more preferably greater than or equal to 1 μm and less than or equal to 10 μm, still more preferably greater than or equal to 1 μm and less than or equal to 5 μm. Alternatively, the element substrate 1102 may be formed by partially separating and thinning the semiconductor substrate.

Then, over the antenna 112, the structure body 115 in which a fibrous body 113 is impregnated with an organic resin 114 is provided. Such a structure body 115 is also called a prepreg. A prepreg is specifically formed in such a manner that, after a fibrous body is impregnated with a composition in which a matrix resin is diluted with an organic solvent, drying is performed so that the organic solvent is volatilized and the matrix resin is semi-cured. The thickness of the structure body 115 is preferably greater than or equal to 10 μm and less than or equal to 100 μm, more preferably greater than or equal to 10 μm and less than or equal to 30 μm. By using a structure body with such a thickness, a thin semiconductor device capable of being curved can be manufactured.

The structure body 115 is heated and subjected to pressure bonding so that the organic resin 114 of the structure body 115 is plasticized or cured. In the case where the organic resin 114 is an organic plastic resin, the organic resin which is plasticized is then cured by cooling to room temperature.

By heating and pressure bonding, the organic resin 114 is uniformly spread over surfaces of the element substrate 1102 and the antenna 112, and cured. Consequently, as shown in FIG. 3B, an organic resin 121 with which the fibrous body 113 is impregnated and which is fixed to one side of the element substrate 1102 and one side of the antenna 112 is obtained. It is to be noted that the organic resin 121 and the fibrous body 113 which are fixed to one side of the element substrate 1102 and one side of the antenna 112 are collectively referred to as a sealing layer 120 in a similar manner to Embodiment Mode 1. A step of pressure bonding of the structure body 115 is performed under an atmospheric pressure or low pressure.

In the manner described above, a semiconductor device can be manufactured. It is to be noted that a sealing layer may also be formed on the semiconductor substrate 101 side. In this case, in a similar manner to FIG. 1A, a structure body is provided on the semiconductor substrate 101 and the structure body is heated and subjected to pressure bonding, so that an organic resin in the structure body is plasticized or cured. In the case where the organic resin is plastic, the plasticized organic resin is then cured by cooling to room temperature. Consequently, as shown in FIG. 3C, a sealing layer 125 including a fibrous body 113 and an organic resin 121 with which the fibrous body 113 is impregnated can be formed. That is, a semiconductor device provided with the sealing layers 120 and 125 on opposing surfaces of the element substrate 1102 can be manufactured.

In the case where a plurality of semiconductor devices are included in the element substrate 1102, the plurality of semiconductor devices may be obtained by dividing the element substrate 1102 and the sealing layers. With such a step, a plurality of semiconductor devices can be manufactured. When the division is performed, selective division is possible by dicing, scribing, using a cutting machine having an edged tool such as scissors or a knife, laser cutting, or the like.

In the semiconductor device described in this embodiment mode, the element substrate having a semiconductor element formed using a single crystal semiconductor substrate or an SOI substrate and a fibrous body are fixed together by an organic resin. In the fibrous body, pressure given by locally pressing is dispersed throughout fiber; thus, local pressure is not easily applied. Accordingly, a wiring or a semiconductor element included in the semiconductor device is not stretched and the semiconductor device is not easily destroyed. Further, because the fibrous body formed from high-strength fiber is fixed to the element substrate, the element substrate is not easily stretched also in a separation step. That is, stretching of the semiconductor element, the wiring, or the like formed in the element substrate can be reduced, and thus, a yield can be improved.

Further, when the element substrate is formed to have a small thickness, the semiconductor device can be curved. Accordingly, the area of the element substrate can be enlarged, and thus, steps of manufacturing the semiconductor device can be easily performed. In the case where the semiconductor device is an RFID with a built-in antenna, the size of the antenna can be increased. Thus, an RFID with a long communication distance can be manufactured.

Embodiment Mode 3

Figure 4A:
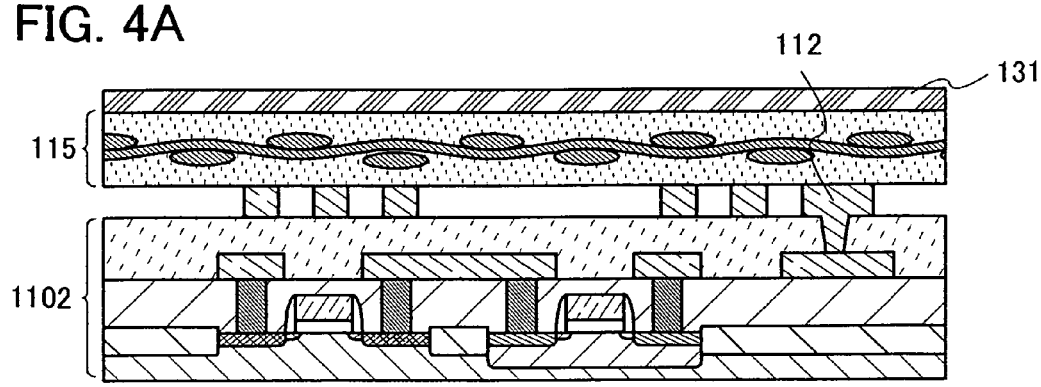
FIGS. 4A to 4C are cross-sectional views illustrating a manufacturing method of a semiconductor device of the present invention.
Figure 4B:
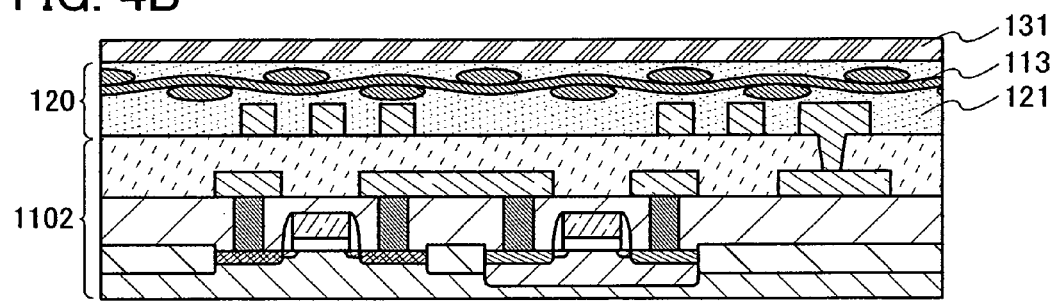
Figure 4C:
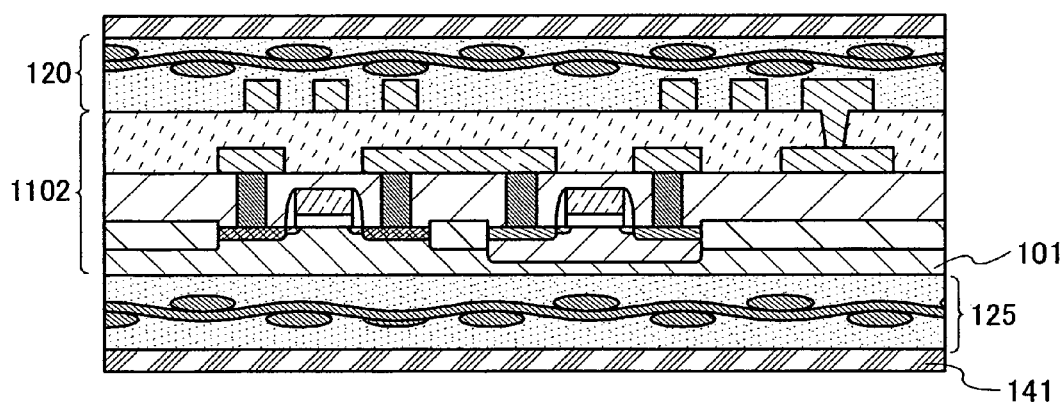

This embodiment mode describes a manufacturing method of a semiconductor device which is not more easily destroyed compared with Embodiment Mode 2, with reference to FIGS. 4A to 4C.

In a similar manner to Embodiment Mode 1, as shown in FIG. 4A, an element substrate 1102 including a semiconductor element formed using a single crystal semiconductor substrate or an SOI substrate, and an antenna 112 are formed. A structure body 115 is provided over the element substrate 1102 and the antenna 112, and a protective film 131 is provided over the structure body 115.

The protective film 131 is preferably formed from a high-strength material. As typical examples of a high-strength material, a polyvinyl alcohol resin, a polyester resin, a polyamide resin, a polyethylene resin, an aramid resin, a polyparaphenylene benzobisoxazole resin, a glass resin, and the like can be given.

Since the protective film 131 is formed from a high-strength material, destruction by local pressure can be further suppressed compared with Embodiment Mode 2. In specific, in a fibrous body 113 of the structure body 115, in the case where the area of a basket hole in which a warp yarn bundle and a weft yarn bundle are not distributed is larger than the area to which local pressure is applied, when the basket hole is locally loaded, the pressure is not absorbed by the fibrous body 113 of the structure body 115 but is directly applied to the element substrate 1102 and the antenna 112. As a result, the element substrate 1102 and the antenna 112 are stretched, and the semiconductor element or the wiring is destroyed.

However, by providing over the structure body 115 the protective film 131 formed from a high-strength material, a local load is absorbed by the entire protective film 131, leading to a semiconductor device which is not easily destroyed by local pressure.

As shown in FIG. 4B, in a similar manner to Embodiment Mode 2, the structure body 115 is heated and subjected to pressure bonding, so that a sealing layer 120 is formed. The protective film 131 is fixed to the element substrate 1102 and the antenna 112 by an organic resin 121. That is, the fibrous body 113 and the protective film 131 are fixed to the element substrate 1102 and the antenna 112 by the sealing layer 120. The fibrous body 113 is impregnated with the organic resin 121 included in the sealing layer 120.

After that, as shown in FIG. 4C, a structure body is provided over a semiconductor substrate 101 of the element substrate 1102, a protective film is formed over the structure body, and heating and pressure bonding are performed, so that a protective film 141 is fixed to the element substrate 1102 by a sealing layer 125.

In FIG. 4A, in the case where the protective film 131 is a thermoplastic material, the protective film 131 may alternatively be provided between the element substrate 1102 and the antenna 112, and the structure body 115, and heating and pressure bonding may be performed. In FIG. 4C, in the case where the protective film 141 is a thermoplastic material, the protective film 141 may be provided between the semiconductor substrate 101 and the sealing layer 125, and heating and pressure bonding may be performed. Also in this structure, a load given by locally pressing can be dispersed in the protective film and the fibrous body of the sealing layer, and accordingly, destruction can be reduced.

In the case where a plurality of semiconductor devices are included in the element substrate 1102, the plurality of semiconductor devices may be obtained by dividing the element substrate 1102 and the sealing layers. With such a step, a plurality of semiconductor devices can be manufactured.

In the manner described above, a semiconductor device with less destruction due to local pressure can be manufactured.

Embodiment Mode 4

This embodiment mode describes a manufacturing method of a semiconductor device in which an antenna is not formed in an element substrate and an antenna provided over another substrate is connected to the element substrate, with reference to FIGS. 5A to 5C and FIGS. 6A and 6B.

Figure 5A:
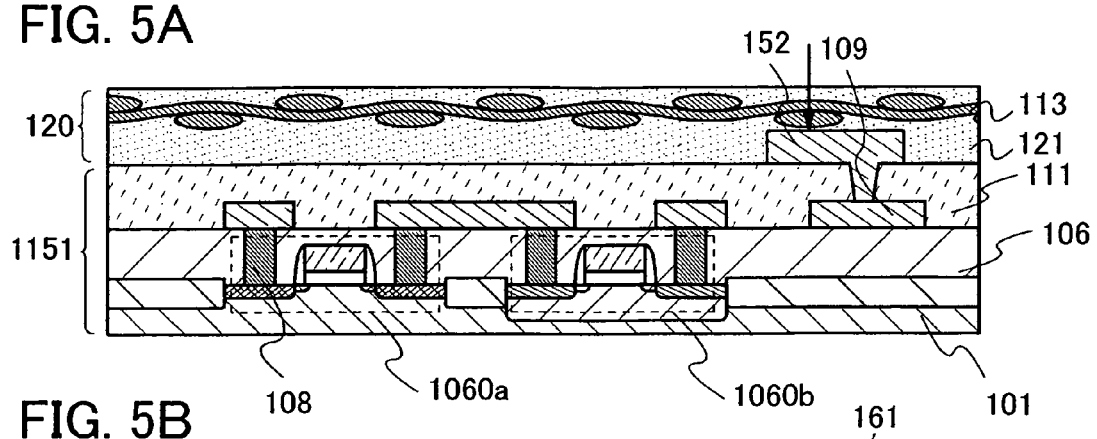
FIGS. 5A to 5C are cross-sectional views illustrating a manufacturing method of a semiconductor device of the present invention.

As shown in FIG. 5A, in a similar manner to Embodiment Mode 2, an element substrate 1151 including a semiconductor element formed using a single crystal semiconductor substrate or an SOI substrate is formed. Then, a structure body in which a fibrous body 113 is impregnated with an organic resin 114 is provided over the element substrate 1151.

Here, as the element substrate 1151, as described in Embodiment Mode 1, MOS transistors 1060a and 1060b are formed over a semiconductor substrate 101. An insulating layer 106 is formed over the MOS transistors 1060a and 1060b, and wirings 108 and 109 which are connected to source regions and drain regions of the MOS transistors through the insulating layer 106 are formed. An insulating layer 111 is formed over the wirings 108 and 109 and the insulating layer 106, and an electrode pad 152 which is connected to the wiring 109 through the insulating layer 111 is formed.

Then, in a similar manner to Embodiment Mode 1, the structure body provided over the element substrate 1151 is heated and subjected to pressure bonding, so that a sealing layer 120 including an organic resin 121 and the fibrous body 113 is formed over one surface of the element substrate 1151.

Then, part of the sealing layer 120 is removed to expose part of the electrode pad 152. Here, the electrode pad 152 is irradiated with a laser beam, as indicated by an arrow in FIG. 5A, from the sealing layer 120 side, so that part of the sealing layer 120 is removed. Alternatively, part of the sealing layer 120 may be removed by a general photolithography process so that part of the electrode pad 152 may be exposed.

Figure 5B:
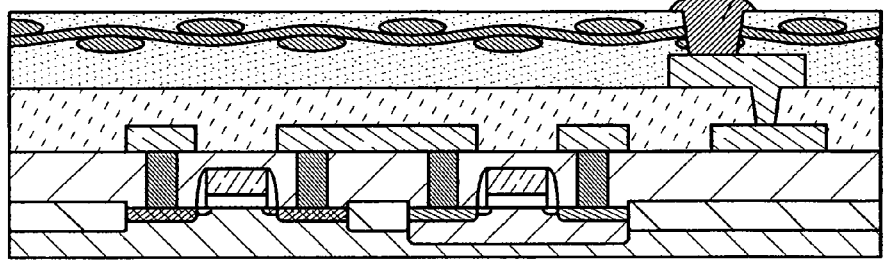

As shown in FIG. 5B, a connection terminal 161 is formed in an opening in the sealing layer 120. The connection terminal 161 can be formed by a printing method, a droplet discharge method, or the like. As a material for the connection terminal 161, particles or dispersing nanoparticles of at least one of metals of silver (Ag), gold (Ag), copper (Cu), nickel (Ni), platinum (Pt), palladium (Pd), tantalum (Ta), molybdenum (Mo), and titanium (Ti), or silver halide can be used.

Figure 5C:
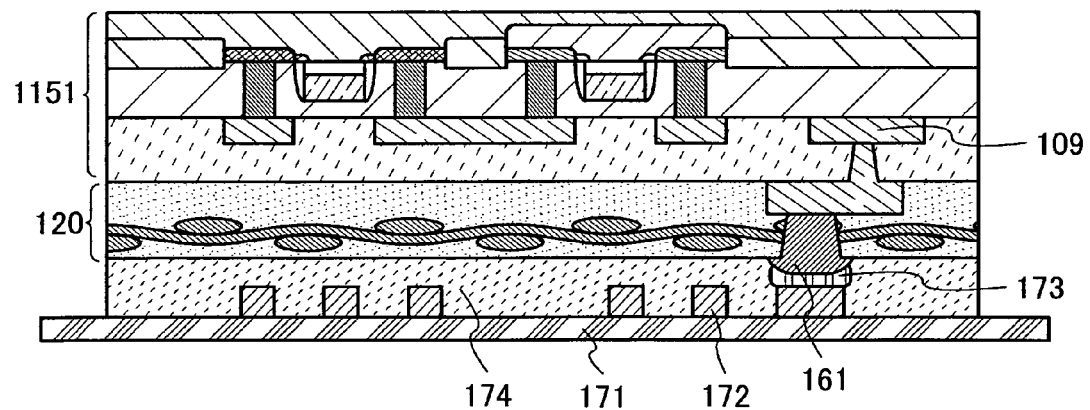

Then, as shown in FIG. 5C, the sealing layer 120 which is fixed to the element substrate 1151 and a substrate 171 over which an antenna 172 is formed are bonded together by an adhesive member 174. At this time, the connection terminal 161 which is formed on the element substrate 1151 and the antenna 172 are electrically connected to each other by an anisotropic conductive adhesive member 173.

As the anisotropic conductive adhesive member 173, an adhesive resin containing conductive particles (each grain size is several nanometers to several tens of micrometers), which are dispersed, such as an epoxy resin or a phenol resin can be given. The conductive particle is formed from one or more elements selected from gold, silver, copper, palladium, nickel, carbon, and platinum. Further, a particle having a multilayer structure of these elements may be used. Furthermore, a conductive particle in which a thin film which is formed from one or more elements selected from gold, silver, copper, palladium, nickel, and platinum is formed over a surface of a particle formed from a resin may be used. Further alternatively, a CNT (carbon nanotube) may be used as the conductive particle.

The antenna 172 can be appropriately formed using a material and a formation method which are similar to those of the antenna 83 described in Embodiment Mode 1.

As the substrate 171 over which the antenna 172 is formed, a plastic film substrate, for example, a plastic substrate of polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or the like can be used.

Figure 6A:
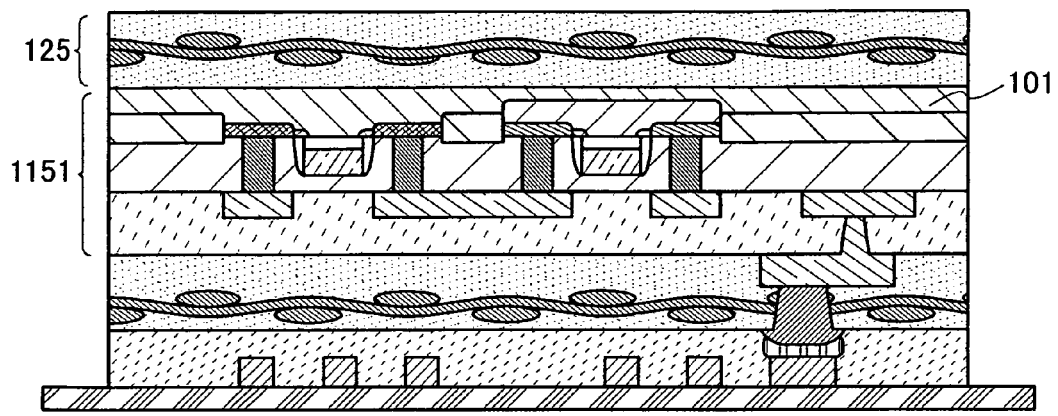
FIGS. 6A and 6B are cross-sectional views illustrating a manufacturing method of a semiconductor device of the present invention.

Then, as shown in FIG. 6A, in a similar manner to Embodiment Mode 1, a structure body is provided over a surface of the semiconductor substrate 101, and heating and pressure bonding are performed, so that a sealing layer 125 is formed over the semiconductor substrate 101.

Figure 6B:
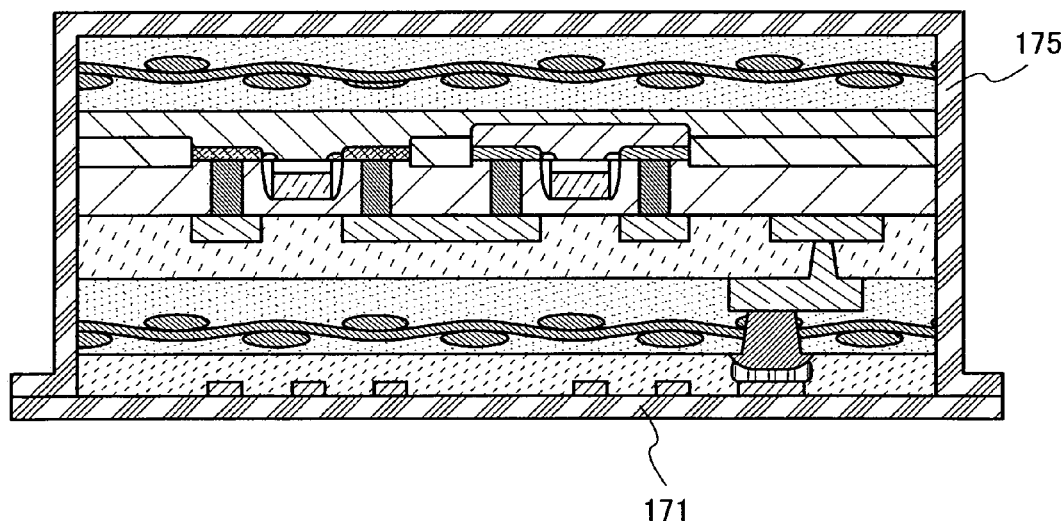

Then, as shown in FIG. 6B, a film 175 may be provided so as to seal the substrate 171 over which the antenna 172 is formed, the sealing layer 120, the element substrate 1151, and the sealing layer 125. The film 175 can be a film similar to the substrate 171 over which the antenna 172 is formed.

Figure 7A:
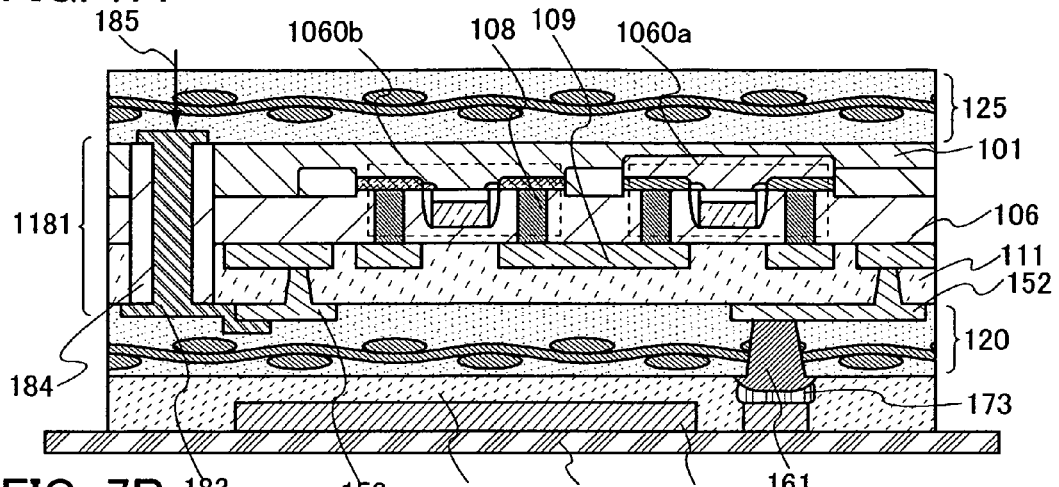
FIGS. 7A to 7C are cross-sectional views illustrating a manufacturing method of a semiconductor device of the present invention.

The above mode describes a semiconductor device in which the substrate 171 having the antenna 172 is bonded to only one surface of the element substrate 1151; however, substrates over each of which an antenna is formed may be bonded to both sides of the element substrate 1151. The mode is described with reference to FIGS. 7A to 7C.

In an element substrate 1181, as described in Embodiment Mode 1, the MOS transistors 1060a and 1060b are formed using a semiconductor substrate 101. An insulating layer 106 is formed over the MOS transistors 1060a and 1060b, and wirings 108 and 109 which are connected to source regions and drain regions of the MOS transistors through the insulating layer 106 are formed. An insulating layer 111 is formed over the wirings 108 and 109 and the insulating layer 106, and an electrode pad 152 and a conductive layer 153 which are connected to the wiring 109 through the insulating layer 111 are formed.

Then, a through hole is formed in the semiconductor substrate 101, the insulating layer 106, and the insulating layer 111. A through electrode 183 is formed on a surface of the through hole. The through electrode 183 is in contact with the conductive layer 153. The through electrode 183 is insulated from the semiconductor substrate 101 by an insulating layer 184.

After that, a connection terminal 161 is formed by a similar step to FIGS. 5A and 5B on one surface of the element substrate 1181. Then, by a step similar to FIG. 5C, a substrate 171 on which an antenna 172 is formed and a sealing layer 120 provided on one surface of the element substrate 1181 are bonded together with an adhesive member 174. At this time, the connection terminal 161 which is formed on the element substrate 1181 and the antenna 172 are electrically connected to each other by an anisotropic conductive adhesive member 173. A sealing layer 125 is provided on the other surface of the element substrate 1181.

A structure body is provided over the semiconductor substrate 101 of the element substrate 1181, and then, heating and pressure bonding are performed, whereby the sealing layer 125 is formed. Then, in order to form a connection terminal which is connected to the through electrode 183, an opening is formed in part of the sealing layer 125. Here, the opening is formed by irradiating the through electrode 183 with a laser beam 185 from the sealing layer 125 side, and part of the through electrode 183 is exposed.

Figure 7B:
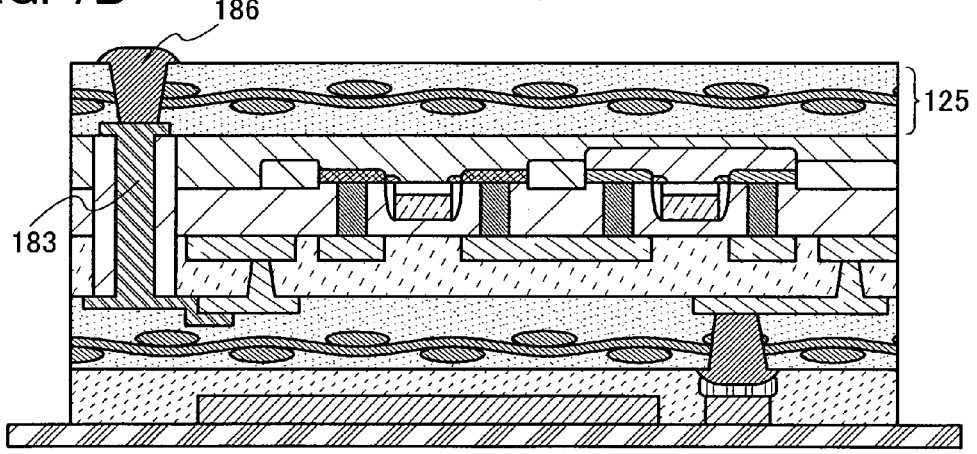

Then, as shown in FIG. 7B, a connection terminal 186 is formed so as to fill the opening. The connection terminal 186 can be formed in a similar manner to the connection terminal 161.

Figure 7C:
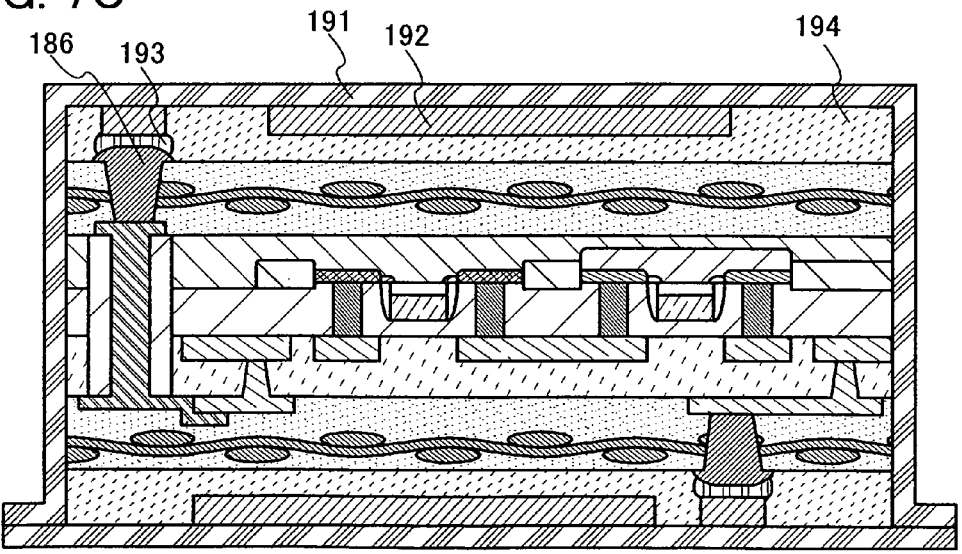

As shown in FIG. 7C, the sealing layer 125 and a substrate 191 provided with an antenna 192 are bonded together with an adhesive member 194, and the connection terminal 186 and the antenna 192 are electrically connected to each other by an anisotropic conductive adhesive member 193.

In the manner described above, a semiconductor device in which antennas are provided on both sides of the element substrate can be manufactured. Such a structure is preferably applied to the semiconductor device having symmetrical antennas such as, an RFID capable of receiving an electric wave of a UHF band, because the size of the semiconductor device can be reduced.

In the case where a plurality of semiconductor devices are included in each of the element substrates 1151 and 1181, the plurality of semiconductor devices may be obtained by dividing the element substrates 1151 and 1181 and the sealing layers. With such a step, a plurality of semiconductor devices can be manufactured.

In the semiconductor device described in this embodiment mode, an element substrate having a semiconductor element formed using a single crystal semiconductor substrate or an SOI substrate and a fibrous body are fixed together by an organic resin. In the fibrous body, pressure given by locally pressing is dispersed throughout fiber; thus, local pressure is not easily applied. Accordingly, a wiring and a semiconductor element included in the semiconductor device are not stretched and the semiconductor device is not easily destroyed. Further, because the fibrous body formed from high-strength fiber is fixed to the element substrate, the element substrate is not easily stretched also in a separation step. That is, stretching of the semiconductor element formed in the element substrate, the wiring, or the like can be reduced, and thus, a yield can be improved.

Further, when the element substrate is formed to have a small thickness, the semiconductor device can be curved. Accordingly, the area of the element substrate can be enlarged, and thus, steps of manufacturing the semiconductor device can be easily performed because a connection area for connecting an external antenna to the element substrate can be enlarged. In the case where the semiconductor device is an RFID with a built-in antenna, the size of the antenna can be increased. Thus, an RFID with a long communication distance can be manufactured.

Embodiment Mode 5

Figure 10A:
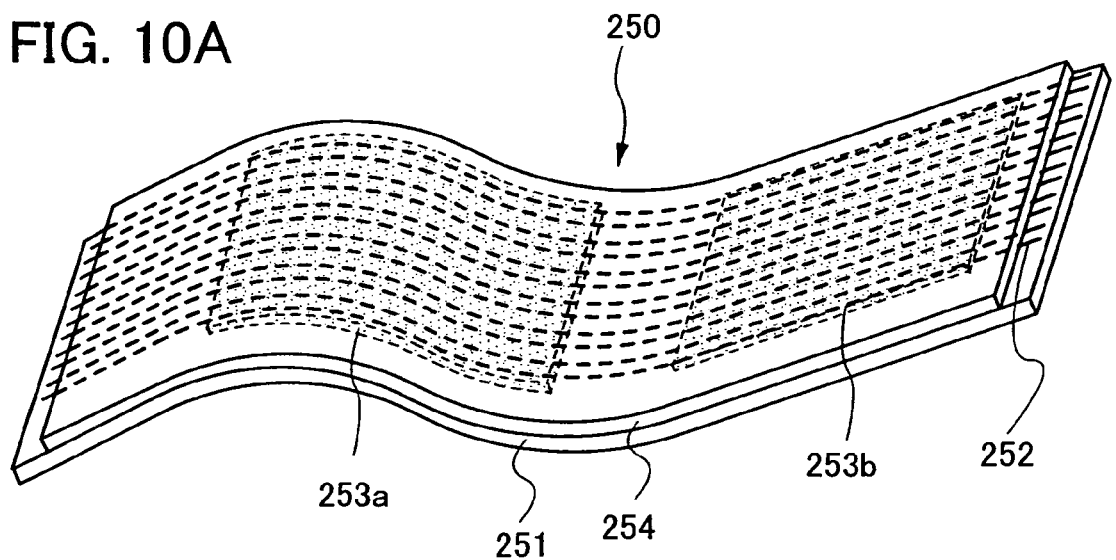
FIGS. 10A and 10B are a perspective view and a cross-sectional view, respectively, each of which illustrates a semiconductor device of the present invention.
Figure 10B:
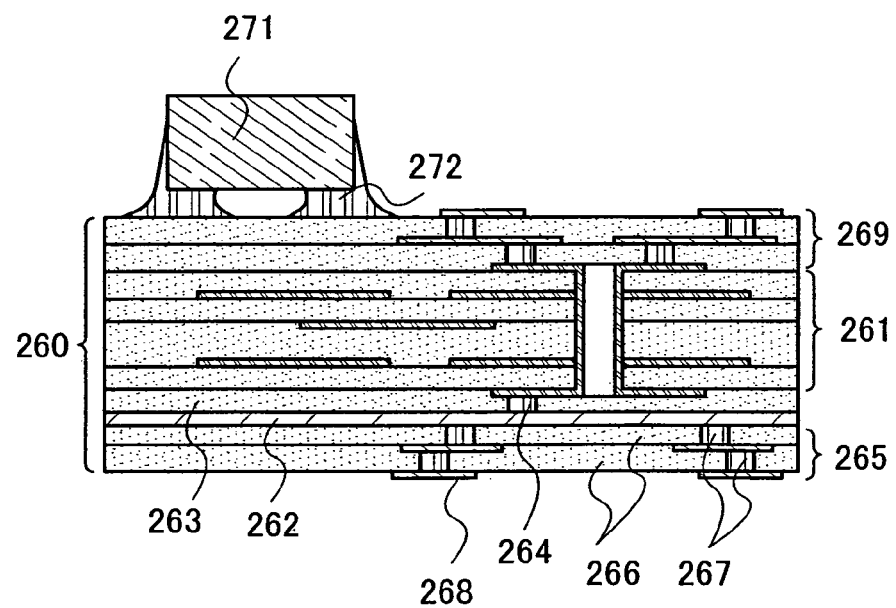

This embodiment mode describes a semiconductor device in which any of the element substrates, which are described in Embodiment Modes 1 to 4, including a semiconductor element formed using a single crystal semiconductor substrate or an SOI substrate is connected to a printed board, with reference to FIGS. 10A and 10B.

FIG. 10A is a perspective view of a semiconductor device 250 of this embodiment mode. In the semiconductor device 250, a flexible printed board is provided with the element substrate including a semiconductor element formed using a non-single crystal semiconductor layer, which is described in one of Embodiment Modes 1 to 4. For example, a wiring 252 formed from copper, gold, silver, aluminum, or the like is provided over a base film 251 formed from polyester, polyimide, or the like. Stacks 253a and 253b, in each of which the element substrate including a semiconductor element formed using a single crystal semiconductor substrate or an SOI substrate, which is described in one of Embodiment Modes 1 to 4, and a sealing layer are stacked are provided over the wiring 252 with an insulating layer interposed between the wiring 252 and the stacks 253a and 253b. The wiring 252 is connected to each of the stacks 253a and 253b through a connection terminal formed in a contact hole of the sealing layer. The base film 251, the wiring 252, and the stacks 253a and 253b are covered with a protective film 254. In an edge portion of the semiconductor device 250, part of the protective film 254 is removed, and an external circuit such as a connector and the wiring 252 are exposed.

The element substrate is provided over the wiring with the sealing layer interposed therebetween, and the element substrate can be fixed to the wiring and the base film by heating and pressure bonding.

Here, the semiconductor device having the wiring 252 of one layer is described above. Alternatively, a multilayer wiring structure may be employed. Further, the stacks 253a and 253b may be interposed between a plurality of wirings. Such a multilayer wiring can increase packing density.

FIG. 10B is a cross-sectional view of a semiconductor device 260 of this embodiment mode. In the semiconductor device 260, the element substrate including a semiconductor element formed using a single crystal semiconductor substrate or an SOI substrate, which is described in one of Embodiment Modes 1 to 4, is provided on a printed board. For example, an element substrate 262 including a semiconductor element formed using a single crystal semiconductor substrate or an SOI substrate, which is described in one of Embodiment Modes 1 to 4, is provided on one surface of a core layer 261. A wiring or the semiconductor element included in the element substrate 262 including the semiconductor element formed using a single crystal semiconductor substrate or an SOI substrate, which is described in one of Embodiment Modes 1 to 4, is connected to the core layer 261 by a via 264 passing through a sealing layer 263.

A build-up layer 265 is provided on the element substrate 262. The core layer 261, and the semiconductor element, the wiring, and the like which are formed in the element substrate 262 are connected to a conductive pattern 268 formed on a surface of the semiconductor device 260, by vias 267 formed in organic resin layers 266 of the build-up layer 265.

A build-up layer 269 is provided on the opposite surface of the core layer 261.

In addition, a chip 271 such as a capacitor, a coil, a resistor, or a diode may be mounted on the semiconductor device 260 with the use of a mounting member 272 such as a conductive paste or a wire.

In the semiconductor device of this embodiment mode, a printed board has a layer including a semiconductor element formed using a single crystal semiconductor substrate or an SOI substrate. Further, the element substrate is provided in the printed board with the use of a prepreg using a fibrous body. Thus, even when a local load (point pressure, linear pressure, or the like) is applied, pressure is dispersed in the fibrous body, and destruction in a mounting step or generated by a curve can be reduced. Furthermore, high integration is possible.

Embodiment Mode 6

This embodiment mode describes a structure and an application example of a semiconductor device of the present invention. Here, an RFID and a memory device are described as typical examples of a semiconductor device.

Figure 11:
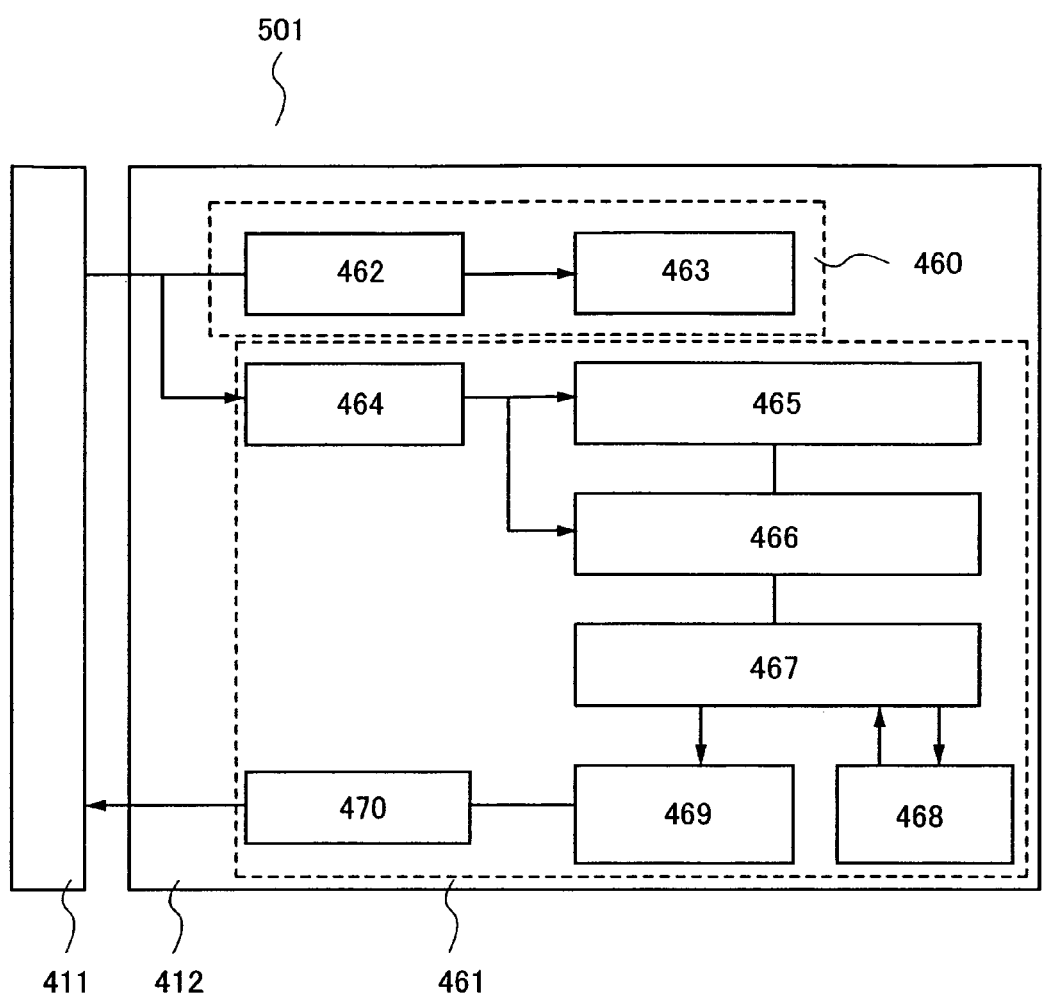
FIG. 11 is a diagram illustrating a semiconductor device of the present invention.

First, a circuit structure example of an RFID 501, which is one of the semiconductor devices of the present invention, is described. FIG. 11 shows a block circuit diagram of the RFID 501.

Specifications of the RFID 501 in FIG. 11 conform to ISO 15693 of the International Organization for Standardization, and it is a vicinity type, and has a communication signal frequency of 13.56 MHz. Also, reception only responds to a data reading instruction, data transmission rate in transmission is about 13 kHz, and the Manchester code is used for a data encoding format.

A circuit portion 412 of the RFID 501 is roughly separated into a power supply portion 460 and a signal processing portion 461. The power supply portion 460 includes a rectification circuit 462 and a storage capacitor 463. Further, the power supply portion 460 may be provided with a protection circuit portion (also called a limiter circuit) to protect the internal circuit when the amount of electric power received by an antenna 411 is too large, and a protection circuit control circuit portion to control whether or not to operate the protection circuit portion. By providing the circuit portions, a malfunction can be prevented, which is caused when the RFID receives the large amount of electric power under the situation or the like in which a communication distance between the RFID and a communication instrument is extremely short. Thus, reliability of the RFID can be improved. That is, the RFID can be normally operated without degradation of an element in the RFID or destruction of the RFID itself.

Here, a communication instrument may have a means for transmitting and receiving information to and from the RFID by wireless communication, and for example, a reader which reads information, a reader/writer having a function of reading and a function of writing, and the like can be given. Further, a mobile phone, a computer, or the like having one of or both the function of reading and the function of writing is also included.

The rectification circuit 462 rectifies a carrier wave received by the antenna 411 and generates direct-current voltage. The storage capacitor 463 smoothes the direct-current voltage generated in the rectification circuit 462. The direct-current voltage generated in the power supply portion 460 is supplied to each circuit of the signal processing portion 461 as power supply voltage.

The signal processing portion 461 includes a demodulation circuit 464, a clock generation/correction circuit 465, a recognition/determination circuit 466, a memory controller 467, a mask ROM 468, an encoding circuit 469, and a modulation circuit 470.

The demodulation circuit 464 is a circuit that demodulates a signal received by the antenna 411. The received signal that is demodulated in the demodulation circuit 464 is input to the clock generation/correction circuit 465 and the recognition/determination circuit 466.

The clock generation/correction circuit 465 has functions of generating a clock signal that is necessary for operating the signal processing portion 461, and also correcting the clock signal. For example, the clock generation/correction circuit 465 includes a voltage controlled oscillator circuit (hereinafter referred to as "VCO circuit"), and turns an output from the VCO circuit into a feedback signal, makes a phase comparison with a supplied signal, and adjusts an output signal by negative feedback so that the feedback signal and a signal that is input are each in a certain phase.

The recognition/determination circuit 466 recognizes and determines an instruction code. The instruction code that is recognized and determined by the recognition/determination circuit 466 is an end-of-frame (EOF) signal, a start-of-frame (SOF) signal, a flag, a command code, a mask length, a mask value, or the like. Also, the recognition/determination circuit 466 has a cyclic redundancy check (CRC) function that identifies a transmission error.

The memory controller 467 reads data from the mask ROM 468 based on a signal processed by the recognition/determination circuit 466. Also, an ID or the like is stored in the mask ROM 468. By mounting the mask ROM 468, the RFID 501 is formed to be dedicated to reading, so that replication or falsification is impossible. Paper which is prevented from forgery can be provided by embedding the RFID 501 dedicated to reading in paper.

The encoding circuit 469 encodes data that is read from the mask ROM 468 by the memory controller 467. The encoded data is modulated in the modulation circuit 470. The data modulated in the modulation circuit 470 is transmitted from the antenna 411 as a carrier wave.

Next, usage examples of RFIDs are described. An RFID of the present invention can be used for various paper media and film media. In particular, the RFID of the present invention can be used for various paper media for which forgery prevention is necessary. The paper media are, for example, banknotes, family registers, residence certificates, passports, licenses, identification cards, membership cards, expert opinions in writing, patient's registration cards, commuter passes, promissory notes, checks, carriage notes, bills of lading, warehouse certificates, stock certificates, bond certificates, gift certificates, tickets, deeds of mortgage, and the like.

Also, by implementing the present invention, a lot of information, more information than that which is visually shown on a paper medium, can be held in the paper medium or the film medium. Accordingly, by applying the RFID of the present invention to a product label or the like, electronic systemization of merchandise management or prevention of product theft can be realized. Usage examples of paper according to the present invention are described below with reference to FIGS. 12A to 12E.

Figure 12A:
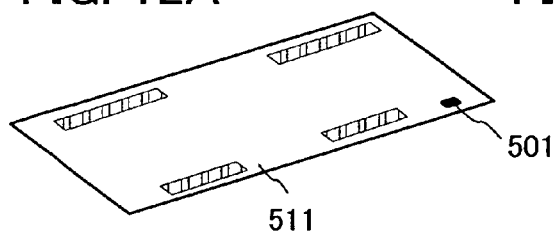
FIGS. 12A to 12E are perspective views each illustrating an application example of a semiconductor device of the present invention.
Figure 12B:
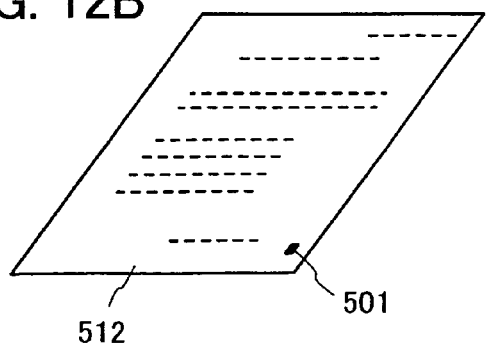

FIG. 12A is an example of a bearer bond 511 using paper embedded with the RFID 501 of the present invention. The bearer bond 511 includes a stamp, a ticket, an admission ticket, a gift certificate, a book coupon, a stationery coupon, a beer coupon, a rice coupon, various gift coupons, various service coupons, and the like, but of course the bearer bond 511 is not limited thereto. Also, FIG. 12B is an example of a certificate 512 using paper embedded with the RFID 501 of the present invention (for example, a residence certificate or a family register).

Figure 12C:
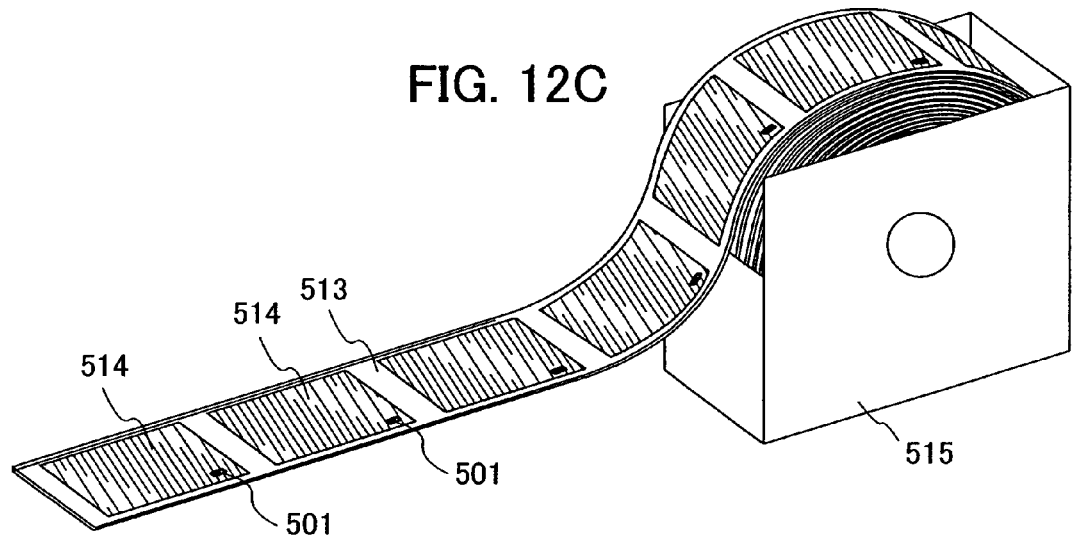

FIG. 12C is an example of applying the RFID of the present invention as a label. A label (ID sticker) 514 is formed of the paper embedded with the RFID 501, over a label base (separate paper) 513. The label 514 is stored in a box 515. On the label 514, information regarding a product or a service (such as product name, brand, trademark, trademark owner, seller, or manufacturer) is printed. Also, since a unique ID number of the product (or a category of the product) is stored in the RFID 501, forgery, infringement of intellectual property rights such as a trademark right or a patent right, and illegal activity such as unfair competition can be spotted easily. To the RFID 501, a large amount of information that cannot all be written on a container or a label of the product can be input, such as the product's area of production, area of sales, quality, raw material, effect, use, quantity, shape, price, production method, usage method, time of production, time of use, expiration date, instruction manual, and intellectual property information relating to the product, for example. Accordingly, a transactor or a consumer can access such information with a simple communication instrument. Further, the information can easily be rewritten, erased, or the like on a producer side, but cannot be rewritten, erased or the like on a transactor or consumer side.

Figure 12D:
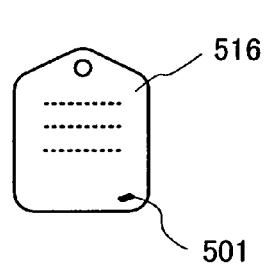
Figure 12E:
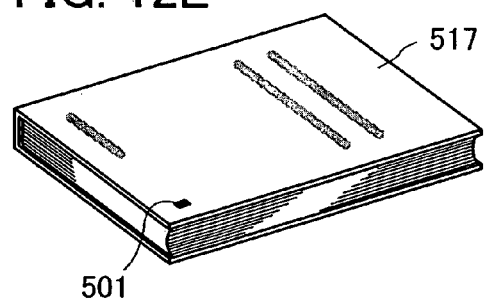

FIG. 12D shows a tag 516 formed of paper or a film which is embedded with the RFID 501. By manufacturing the tag 516 with the paper or film which is embedded with the RFID 501, the tag can be manufactured less expensively than a conventional ID tag using a plastic chassis. FIG. 12E shows a book 517 using the RFID of the present invention for a cover, and the RFID 501 is embedded in the cover.

By attaching the label 514 or the tag 516, on which an RFID as an example of a semiconductor device of the present invention is mounted, to the product, merchandise management becomes easy. For example, when the product is stolen, the perpetrator can be spotted quickly by following a route of the product. In this manner, by using the RFID of the present invention for an ID tag, historical management of the product's raw material, area of production, manufacturing and processing, distribution, sales, and the like, as well as tracking inquiry becomes possible. That is, the product becomes traceable. Also, by the present invention, a tracing management system of the product can be introduced at lower cost than before.

An RFID which is an example of a semiconductor device of the present invention is not easily destroyed by local pressure. Accordingly, a paper medium and a film medium each having an RFID which is an example of a semiconductor device of the present invention can be curved in a process such as attachment or setting, leading to improvement of processing efficiency. Further, since information can be written with a writing material to a paper medium or a film medium each having an RFID which is an example of a semiconductor device of the present invention, the range of uses is increased.

Next, a structure of a memory device which is one mode of a semiconductor device of the present invention is described below. Here, description is made by using a nonvolatile memory device as a typical example of a memory device.

Figure 13:
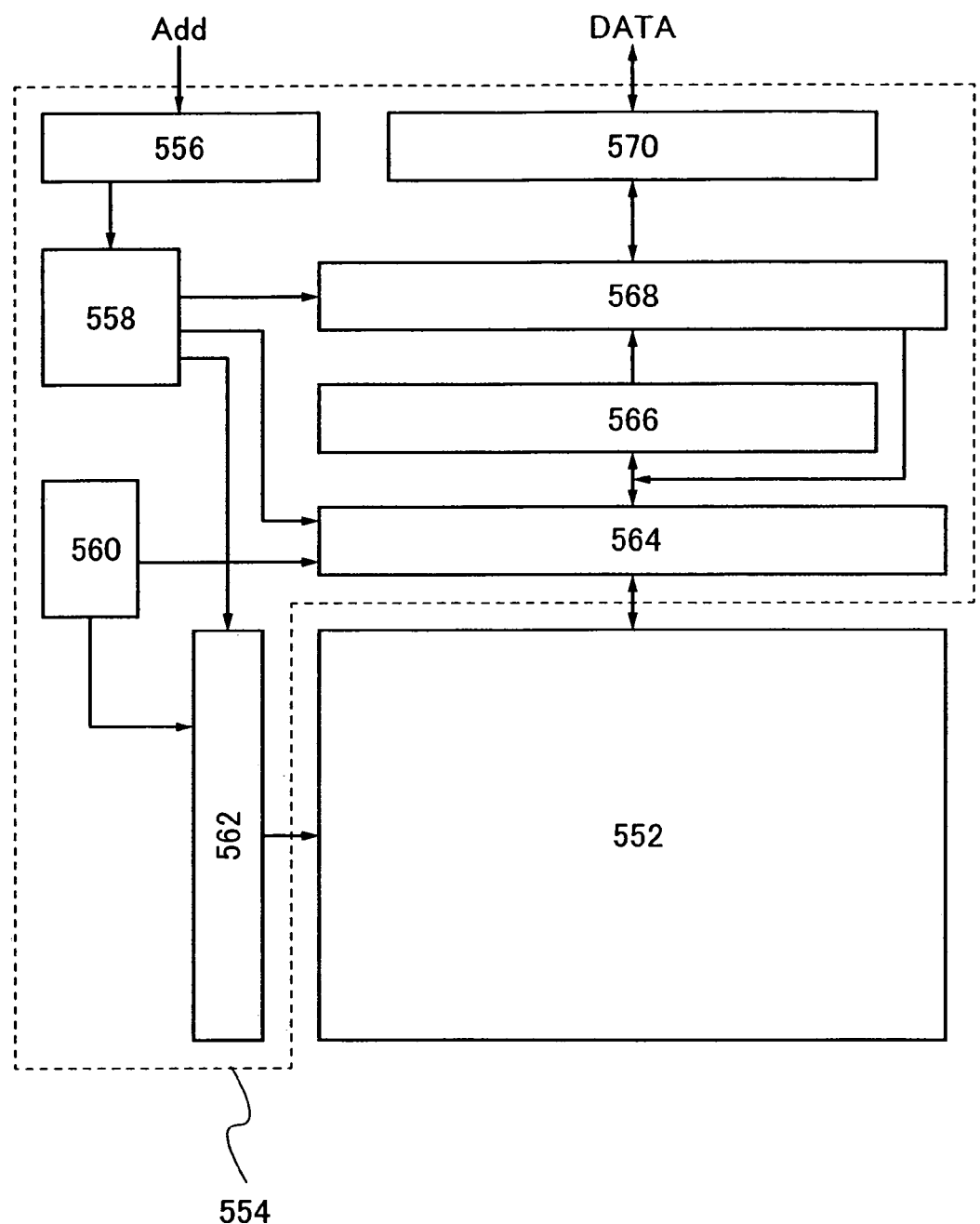
FIG. 13 is a diagram illustrating a semiconductor device of the present invention.

FIG. 13 shows an example of a circuit block diagram of a nonvolatile semiconductor memory device. The nonvolatile semiconductor memory device includes a memory cell array 552 and a peripheral circuit 554 which are formed over the same element substrate. The memory cell array 552 has a nonvolatile memory element as described in Embodiment Mode 1. A structure of the peripheral circuit 554 is as described below.

A row decoder 562 for selecting a word line and a column decoder 564 for selecting a bit line are provided around the memory cell array 552. An address is sent to a control circuit 558 through an address buffer 556, and an internal row address signal and an internal column address signal are transferred to the row decoder 562 and the column decoder 564, respectively.

Potential obtained by boosting power supply potential is used for writing and erasing of data. Therefore, a booster circuit 560 controlled by the control circuit 558 according to an operation mode is provided. Output of the booster circuit 560 is supplied to a word line or a bit line through the row decoder 562 or the column decoder 564. Data output from the column decoder 564 is input to a sense amplifier 566. Data read by the sense amplifier 566 is retained in a data buffer 568. Data retained in the data buffer 568 is accessed randomly by control by the control circuit 558, and is output through a data input/output buffer 570. Writing data is once retained in the data buffer 568 through the data input/output buffer 570 and is transferred to the column decoder 564 by control by the control circuit 558.

Embodiment Mode 7

This embodiment mode describes an electronic device using a semiconductor device of the present invention.

As electronic devices to which a semiconductor device of the present invention is applied, cameras such as video cameras or digital cameras, goggle displays (head mounted displays), navigation systems, audio reproducing devices (e.g., car audio or audio component sets), computers, game machines, portable information terminals (e.g., mobile computers, mobile phones, portable game machines, or electronic books), and image reproducing devices provided with storage media (specifically, a device for reproducing the content of a storage medium such as a DVD (Digital Versatile Disc) and having a display for displaying the reproduced image) can be given. FIGS. 14A to 14E show specific examples of such electronic devices.

Figure 14A:
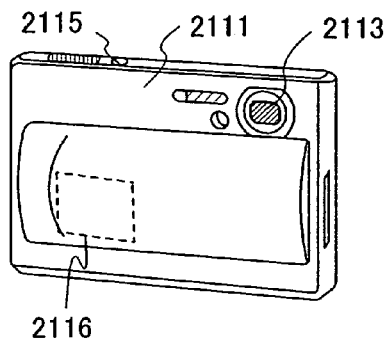
FIGS. 14A to 14E are views each illustrating an electronic device to which a semiconductor device of the present invention can be applied.
Figure 14B:
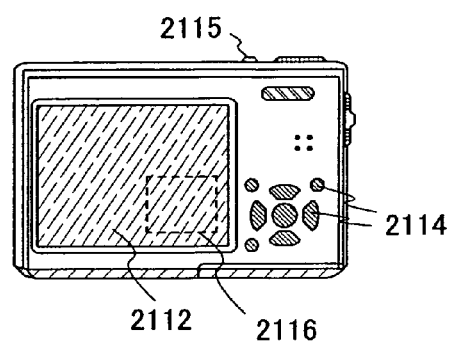

FIGS. 14A and 14B show a digital camera. FIG. 14B shows a rear side of FIG. 14A. This digital camera includes a housing 2111, a display portion 2112, a lens 2113, operating keys 2114, a shutter button 2115, and the like. A semiconductor device 2116 of the present invention which has a function as a storage device, an MPU, an image sensor, or the like is provided inside the housing 2111.

Figure 14C:
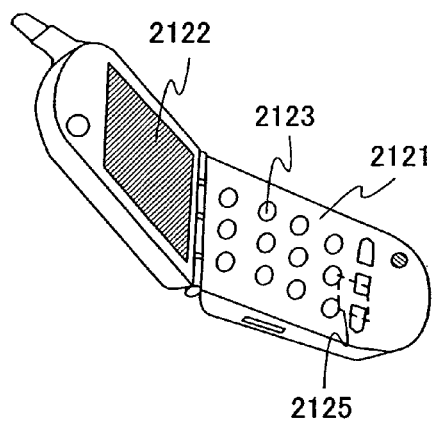

FIG. 14C shows a mobile phone which is one typical example of a portable terminal. This mobile phone includes a housing 2121, a display portion 2122, operating keys 2123, and the like. A semiconductor device 2125 of the present invention which has a function as a storage device, an MPU, an image sensor, or the like is provided inside the mobile phone.

Figure 14D:
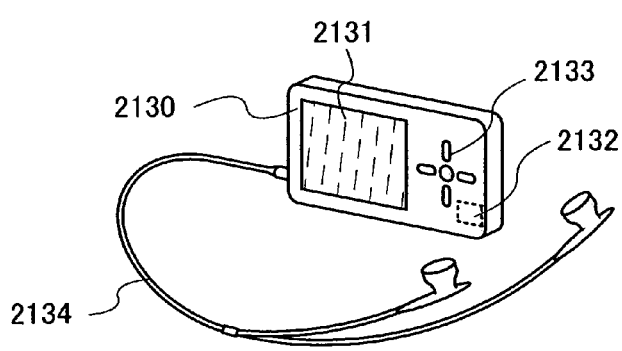

FIG. 14D shows a digital player which is one typical example of an audio device. The digital player shown in FIG. 14D includes a main body 2130, a display portion 2131, a semiconductor device 2132 of the present invention which has a function as a storage device, an MPU, an image sensor, or the like, an operating portion 2133, a pair of earphones 2134, and the like.

Figure 14E:
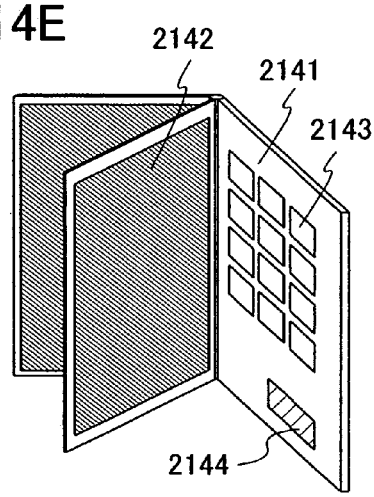

FIG. 14E shows an e-book device (also called electronic paper). This e-book device includes a main body 2141, a display portion 2142, operating keys 2143, and a semiconductor device 2144 of the present invention which has a function as a storage device, an MPU, an image sensor, or the like. In addition, a modem may be built into the main body 2141, or a structure capable of wireless data transmission and reception may be employed.

In the manner described above, the applicable range of the semiconductor device of the present invention is so wide that the semiconductor device can be applied to other electronic devices.

This application is based on Japanese Patent Application serial no. 2007-064052 filed with Japan Patent Office on Mar. 13, 2007, the entire contents of which are hereby incorporated by reference.

What is claimed is:

1. A semiconductor device comprising:
a semiconductor element;
a sealing layer including a fibrous body and an organic resin, the fibrous body being impregnated with the organic resin; and
a protective film over the sealing layer,
wherein the sealing layer is fixed to at least one of surfaces of the semiconductor element.

2. The semiconductor device according to claim 1, wherein the fibrous body is one of a woven fabric and an unwoven fabric.

3. The semiconductor device according to claim 1, wherein the organic resin includes one of a thermosetting resin and a thermoplastic resin.

4. The semiconductor device according to claim 3, wherein the thermosetting resin is one of an epoxy resin, an unsaturated polyester resin, a polyimide resin, a bismaleimide-triazine resin, and a cyanate resin.

5. The semiconductor device according to claim 3, wherein the thermoplastic resin is one of a polyphenylene oxide resin, a polyetherimide resin, and a fluorine resin.

6. The semiconductor device according to claim 1, wherein the semiconductor element is one or more of a MOS transistor, a nonvolatile memory element, and a diode.

7. The semiconductor device according to claim 1, further comprising an antenna between the semiconductor element and the sealing layer, the antenna being electrically connected to the semiconductor element.

8. The semiconductor device according to claim 1, wherein the protective film comprises one of a polyvinyl alcohol resin, a polyester resin, a polyamide resin, a polyethylene resin, an aramid resin, a polyparaphenylene benzobisoxazole resin, and a glass resin.

9. A semiconductor device comprising:
an element substrate including an active element and an insulating layer, the active element being formed using one of a single crystal semiconductor substrate and an SOI substrate and being covered with the insulating layer;
a sealing layer including a fibrous body and an organic resin, the fibrous body being impregnated with the organic resin;
an antenna between the element substrate and the sealing layer, the antenna being electrically connected to the active element of the element substrate; and
a protective film over the sealing layer,
wherein the sealing layer is fixed to at least one of surfaces of the element substrate.

10. The semiconductor device according to claim 9, wherein the fibrous body is one of a woven fabric and an unwoven fabric.

11. The semiconductor device according to claim 9, wherein the organic resin includes one of a thermosetting resin and a thermoplastic resin.

12. The semiconductor device according to claim 11, wherein the thermosetting resin is one of an epoxy resin, an unsaturated polyester resin, a polyimide resin, a bismaleimide-triazine resin, and a cyanate resin.

13. The semiconductor device according to claim 11, wherein the thermoplastic resin is one of a polyphenylene oxide resin, a polyetherimide resin, and a fluorine resin.

14. The semiconductor device according to claim 9, wherein the active element is one or more of a MOS transistor, a nonvolatile memory element, and, a diode.

15. The semiconductor device according to claim 9, wherein the protective film comprises one of a polyvinyl alcohol resin, a polyester resin, a polyamide resin, a polyethylene resin, an aramid resin, a polyparaphenylene benzobisoxazole resin, and a glass resin.

16. A semiconductor device comprising:
an element substrate including an active element and an insulating layer, the active element being formed using one of a single crystal semiconductor substrate and an SOI substrate and being covered with the insulating layer;
a sealing layer including a fibrous body and an organic resin, the fibrous body being impregnated with the organic resin and having a plurality of warp yarns and a plurality of weft yarns each formed by bundling a plurality of single yarns;
an antenna between the element substrate and the sealing layer, the antenna being electrically connected to the active element of the element substrate; and
a protective film over the sealing layer,
wherein the sealing layer is fixed to at least one of surfaces of the element substrate.

17. The semiconductor device according to claim 16, wherein the fibrous body is one of a woven fabric and an unwoven fabric.

18. The semiconductor device according to claim 16, wherein each of a distance between the plurality of warp yarns and a distance between the plurality of weft yarns is greater than or equal to 0.01 mm and less than or equal to 0.2 mm.

19. The semiconductor device according to claim 16, wherein the organic resin includes one of a thermosetting resin and a thermoplastic resin.

20. The semiconductor device according to claim 19, wherein the thermosetting resin is one of an epoxy resin, an unsaturated polyester resin, a polyimide resin, a bismaleimide-triazine resin, and a cyanate resin.

21. The semiconductor device according to claim 19, wherein the thermoplastic resin is one of a polyphenylene oxide resin, a polyetherimide resin, and a fluorine resin.

22. The semiconductor device according to claim 16, wherein the active element is one or more of a MOS transistor, a nonvolatile memory element, and a diode.

23. The semiconductor device according to claim 16, wherein the protective film comprises one of a polyvinyl alcohol resin, a polyester resin, a polyamide resin, a polyethylene resin, an aramid resin, a polyparaphenylene benzobisoxazole resin, and a glass resin.

24. A semiconductor device comprising:
a semiconductor element; and
a sealing layer including a fibrous body and an organic resin, the fibrous body being impregnated with the organic resin,
wherein the sealing layer is fixed to at least one of surfaces of the semiconductor element, and
wherein a thermally conductive filler is dispersed in the sealing layer.

* * * * *